United States Patent
Bishay

(10) Patent No.: US 8,917,327 B1
(45) Date of Patent: Dec. 23, 2014

(54) METHOD TO USE ARRAY SENSORS TO MEASURE MULTIPLE TYPES OF DATA AT FULL RESOLUTION OF THE SENSOR

(71) Applicant: icClarity, Inc., Newport Coast, CA (US)

(72) Inventor: Magued (aka Fr. Gregory) Bishay, Anaheim, CA (US)

(73) Assignee: icClarity, Inc., Newport Coast, CA (US)

( * ) Notice: Subject to any disclaimer, the term of this patent is extended or adjusted under 35 U.S.C. 154(b) by 0 days.

(21) Appl. No.: 14/306,844

(22) Filed: Jun. 17, 2014

Related U.S. Application Data

(60) Provisional application No. 61/961,031, filed on Oct. 4, 2013, provisional application No. 61/961,821, filed on Oct. 25, 2013, provisional application No. 61/925,339, filed on Jan. 9, 2014.

(51) Int. Cl.
 *H04N 5/225* (2006.01)
 *H01L 27/146* (2006.01)
 *H04N 9/04* (2006.01)

(52) U.S. Cl.
 CPC .......... *H01L 27/14621* (2013.01); *H04N 9/045* (2013.01); *H04N 2209/045* (2013.01)
 USPC ........................................ 348/219.1; 348/279

(58) Field of Classification Search
 USPC .............. 348/305, 219.1, 272, 273, 275–280, 348/310
 See application file for complete search history.

(56) References Cited

U.S. PATENT DOCUMENTS

| | | | | |
|---|---|---|---|---|
| 6,046,772 A | * | 4/2000 | Howell | 348/273 |
| 7,772,532 B2 | | 8/2010 | Olsen et al. | |
| 8,233,143 B2 | | 7/2012 | Cho et al. | |
| 2003/0112353 A1 | * | 6/2003 | Morris | 348/310 |
| 2004/0174436 A1 | * | 9/2004 | Miyahara et al. | 348/219.1 |
| 2010/0103294 A1 | * | 4/2010 | Min et al. | 348/273 |
| 2010/0118123 A1 | | 5/2010 | Freedman et al. | |
| 2011/0102547 A1 | | 5/2011 | Sul et al. | |
| 2012/0062705 A1 | | 3/2012 | Ovsiannikov et al. | |
| 2012/0224028 A1 | | 9/2012 | Park et al. | |
| 2012/0281206 A1 | | 11/2012 | Ko et al. | |
| 2013/0188026 A1 | | 7/2013 | Hiramoto et al. | |

FOREIGN PATENT DOCUMENTS

| | | |
|---|---|---|
| GB | 2485609 A | 5/2012 |
| WO | WO 2013/009662 A2 | 1/2013 |
| WO | WO 2013/009662 A3 | 3/2013 |

OTHER PUBLICATIONS

Bhat, et al. On the derivation of the Bayesian information criterion. Technical report, University of California, Merced, 2010.

Camera Calibration Toolbox for Matlab. 2014. http://www.vision.caltech.edu/bouguetj/calib_doc/index.html.

(Continued)

*Primary Examiner* — Sinh Tran
*Assistant Examiner* — Zhenzhen Wu
(74) *Attorney, Agent, or Firm* — Wilson Sonsini Goodrich & Rosati

(57) ABSTRACT

An actuator is configured to move a sensor array between first and second positions in order to provide color image data and other data with full resolution of the sensor array. In many embodiments, the output resolution of the sensor array for each type of data comprises twice the resolution of the sensor array without movement. The alternating movement of the sensor array between the first and second positions provides output images with decreased artifacts that might otherwise be present without the alternating movement of the sensor array.

11 Claims, 19 Drawing Sheets

(56) References Cited

OTHER PUBLICATIONS

Camplani, et al. Efficient spatio-temporal hole filling strategy for kinect depth maps. Three-Dimensional Image Processing (3DIP) and Applications, 2012.

Cho, et al. Dynamic 3d human actor generation method using a time-of-flight depth camera. In IEEE Transactions on Consumer Electronics, vol. 54, pp. 1514-1521, 2008.

Diebel, et al. An application of markov random fields to range sensing. In Advances in neural information processing systems, vol. 18, pp. 291-295, 2006.

ISSCC: Samsung RGN/IR-ToF paper reviewed. Image Sensors World. Feb. 25, 2012. http://image-sensors-world.blogspot.ca/2012/02/isscc-samsung-rgbir-tof-paper-reviewed.html.

Khoshelham. Accuracy analysis of kinect depth data. In ISPRS Workshop Laser Scanning, 2011.

Park, et al. High quality depth map upsampling for 3d-tof cameras. In International Conference on Computer Vision (ICCV), 2011.

PMD vision. Camboard nano 3D camera. Website. 2014. http://www.pmdtec.com/products_services/reference_design.php.

PrimeSense Inc. Prime Sensor NITE 1.3 Algorithms notes, 2010.

Rother, et al. Grabcut—interactive foreground extraction using iterated graph cuts. In Proceedings of ACM SIGGRAPH, 2004; 309-314.

Samsung creates camera sensor that captures depth, promises to ship flexible displays 'within a year'. 9to5google staff. Mar. 1, 2012. http://9to5google.com/2012/03/01/samsungs-creates-camera-sensor-that-captures-depth-promises-to-ship-flexible-displays-within-a-year/.

Yang, et al. Spatial-depth super resolution for range images. In IEEE Conference on Computer Vision and Pattern Recognition (CVPR), 2007.

Youtube. How the Kinect Depth Sensor Works in 2 Minutes. Feb. 16, 2013. http://www.youtube.com/watch?v=uq9SEJxZiUg.

* cited by examiner

METHOD TO USE ARRAY SENSORS TO MEASURE MULTIPLE TYPES OF DATA AT FULL RESOLUTION OF THE SENSOR

CROSS-REFERENCE

The present application claims the benefits of U.S. Provisional Application Ser. Nos. 61/961,031, filed Oct. 4, 2013, 61/961,821, filed Oct. 25, 2013, and 61/925,339, filed Jan. 9, 2014, the full disclosures of which are incorporated herein by reference.

COPYRIGHT NOTICE

A portion of the disclosure of this patent document contains material that is subject to copyright protection. The copyright owner has not objection to the facsimile reproduction by anyone of the patent document or the patent disclosure as it appears in the Patent and Trademark Office patent files or records, but otherwise reserves all copyright rights whatsoever.

BACKGROUND OF THE INVENTION

Sensors are devices that measure values of data. The data can be measured as a single value via a single sensor, such as measuring a velocity vector, or in the form of multiplicity of measurements of the data, such as measuring the intensity of light falling within a certain band or spectrum in a certain scene, or being emitted as a result of certain stimulus to an object, such magnetic resonance imaging (MRI).

Sensors can be in the form of a single-dimensional or two-dimensional array. Two dimensional array sensors have a multiplicity of "small" measuring areas, or "microsensors". Traditionally, two-dimensional array of microsensors are fabricated to be sensitive to a certain type of measurement; that is, the array is fabricated to measure a single type of data. An example of sensor arrays that are formed from a multiplicity of microsensors is an everyday camera. Cameras contain microsensors, called pixels, that are sensitive to visible light, i.e. each microsensor measures the intensity of light falling on its surface. Each microsensor (or pixel) has a photo-electric area which is in charge of collecting incoming light and converting it to an electric signal that is a function of the intensity of that light. Therefore, when the light falls on each of the microsensors, the light is converted to an electrical signal that is read as an analog value. The choice of the microsensor whose value is to be read is done by using a decoding circuitry which chooses the row and column connected to the microsensors. The value is amplified, converted to a digital value, and stored in a memory for subsequent use in a digital computing and processing system, which can be employed in different applications.

The array of pixels can be made sensitive to different colors, by putting different light-admittance filters, one on every pixel. For example, one filter can admit light in the green color spectrum, another in the red-color spectrum, and a third in the blue-color spectrum. The Bayer pattern is a commonly used microsensor (pixel) layout for a two dimensional sensor array that are used in—visible spectrum—cameras.

Measuring two different types of data can be categorically divided into two philosophies: first, the straight-forward approach of using a separate sensor for every measurement, one for grabbing visible images, and the other for grabbing infrared data (to be used for depth computation). The second approach is to use a mix between the pixels that measure visible light and the pixels that measure infrared. The first approach has the disadvantage of employing a separate sensor. The second approach has two major drawbacks. First, it has a loss of resolution of both measurements since the pixel array is being space shared by different types of microsensors. Second where the microsensor of depth is put "under" the microsensors of visible light, a dramatic degradation of the image quality of the visible image may occur.

These and other needs are addressed by the various aspects, embodiments, and/or configurations of the present disclosure.

SUMMARY OF THE INVENTION

The present disclosure is directed to an image processing system able to capture multiple types of data. The teachings of this disclosure apply to charge coupled devices (CCD's) and complementary metal-oxide-semiconductor (CMOS) technologies employed for light sensing devices. In many embodiments, an actuator is configured to move a sensor array between first and second positions in order to provide color image data and other data with full resolution of the sensor array. In many embodiments, the output resolution of the sensor array for each type of data comprises twice the resolution of the sensor array without movement. The alternating movement of the sensor array between the first and second positions provides output images with decreased artifacts that might otherwise be present without the alternating movement of the sensor array.

In one aspect, disclosed herein is an apparatus comprising: (a) a sensor array comprising a plurality of Bayer patterns disposed on a first plurality of pairs of adjacent linear arrays to sense Bayer pattern data, a second plurality of pairs of adjacent linear arrays having different patterns located between the first plurality of pairs of adjacent linear arrays to sense a different type of data; (b) an actuator to move the sensor array from a first position to a second position, wherein physical positions of the first plurality of adjacent pairs of linear arrays alternate with physical positions of the second plurality of pairs of adjacent linear arrays; and (c) circuitry coupled to the actuator and the sensor array to output the Bayer pattern data and the different type of data from each of the first position and the second position. In some embodiments, each pixel of the Bayer pattern data is output associated with the first position or the second position and wherein each pixel of the different type of data is output associated with the first position or the second position.

In some embodiments, the different pattern comprises one or more of an infrared filter pattern, an ultraviolet filter pattern, a non-Bayer visible light filter pattern, or a pattern comprising no filter.

In some embodiments, each of the pairs of the first plurality of pairs of the adjacent linear arrays comprises two adjacent pairs and wherein each of the second plurality of pairs of adjacent linear arrays comprises two adjacent pairs of linear arrays.

In some embodiments, each of the pairs of the first plurality of pairs of the adjacent linear arrays comprises three or more adjacent pairs of linear arrays and wherein each of the second plurality of pairs of adjacent linear arrays comprises three or more adjacent pairs of linear arrays.

In some embodiments, the apparatus further comprises a first limit switch to signal when the sensor array is located in the first position and a second limit switch to signal when the sensor array is located in the second position, wherein the circuitry is configured to integrate first composite data of the sensor array in the first position in response to the first limit switch sensing the sensor array moving into the first position and integrate second composite data of the sensor array in response to the second limit switch sensing the sensor moving into the second position.

In some embodiments, the circuitry in the apparatus is configured to generate the Bayer pattern data from the first composite data and the second composite data and to generate the different type of data from the first composite data and the second composite data.

In some applications, the circuitry comprising instructions to move the sensor array to the first position and measure first data of the sensor array in the first position and move the sensor array to the second position and measure second data of the sensor array in the second position, the processor further comprising instructions to provide a first full frame image from the first plurality of pairs of adjacent linear arrays having the Bayer pattern and to output a second full frame image from the second plurality of pairs of adjacent linear arrays having different pattern, wherein the sensor comprises a number of pixels and wherein each of the first full frame image and the second full frame image comprising the number of pixels of the sensor array.

In certain embodiments, the actuator in the apparatus comprises a micro-electrical mechanical system.

In some applications, each of the plurality of Bayer patterns comprises a red pixel to sense red light, a blue pixel to sense blue light, and a pair of diagonal green pixels to sense green light. Additionally, the fourth sensor senses an infrared electromagnetic wave, and/or a circuitry is coupled to the moveable gate to control the motion of the gate.

In some embodiments, the apparatus further comprises digital data storage to store an output generated from the sensor arrays.

In certain embodiments, the apparatus further comprises a digital signal processor to control one or more of the following: transferring the output to digital data storage, timing of the image acquisition, movement of the arrays, configuring the circuitry, configuring image formation, and generating images.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

Figure 1:
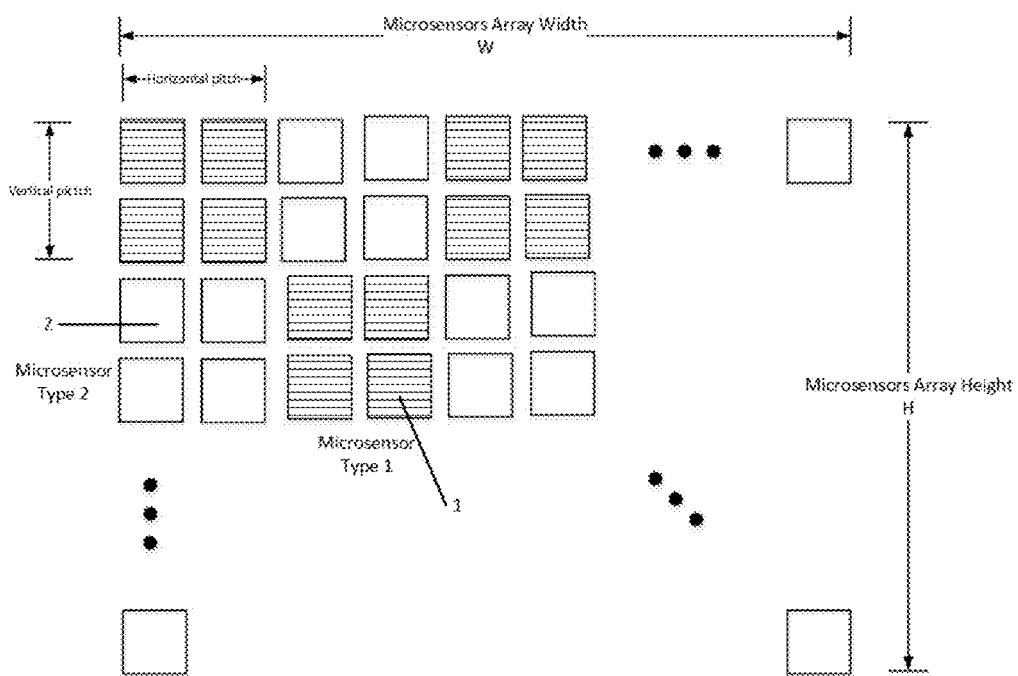
FIG. 1 depicts a microsensor array; in this case, an array of microsensors are arranged in a geometrical layout, a rectangular two dimensional array with equal interlacing of two types of the microsensors, in accordance with embodiments.

In some embodiments, the apparatuses, devices, and systems described herein include: (a) a sensor array operable to sense a first type of data and a second type of data, the first and second types of data being different; and (b) a micro-electrical mechanical system (MEMS) to move at least one of (i) the sensor array such that, at a common location, different sensors of the sensor array capture different ones of the first and second type of data and (ii) a filter positioned over at least one of the sensors of the sensor array such that a selected sensor can capture first or second type of data depending on the position of the filter. In some embodiments, in a first operating mode, a first composite frame are captured by the sensor array and, in a second operating mode, a second composite frame can be captured by the sensor array. Each of the first and the second composite frames comprises first and second types of data. In some embodiments, the first and second composite frames can be divided into a first frame comprising only the first type of data and a second frame comprising only the second type of data. In further embodiments, the first and second frames are stored in different and discrete computer readable media. Alternatively, the first and second frames are stored in different and nonoverlapping memory locations.

In some embodiments, the first type of data is visible light (e.g., one or more of red, blue and green light), and the second type of data can be infrared light. The sensor array includes a first set of sensors to sense the first type of data and a second set of sensors to sense the second type of data. The first set of sensors preferably has different membership than the second set of sensors. In some embodiments, the MEMS moves the sensor array from first to second positions to collect the first and second frames, respectively. The first and second sets of sensors can be interlaced with one another on a row-by-row and/or column-by-column basis. A distance and direction of movement of the sensor array by the MEMS is commonly a function of the type of interlacing employed.

In some embodiments, the MEMS move the filter positioned over at least one of the sensors such that a selected sensor can capture first or second type of data depending on the position of the filter. The first type of data is commonly one or more of blue, green and red light and the second type of data is commonly infrared light. In some embodiments, the filter block substantially (i) the one or more of blue, green and red light while passing infrared light or (ii) infrared light while passing the one or more of the blue, green and red light. In a first operating mode, the MEMS positions the filter over the selected sensor to filter light before the light contacts the selected sensor and, in a second operating mode, the MEMS removes the filter from the selected sensor to enable unfiltered light to contact the selected sensor.

In some embodiments, multiple filters are used. A first filter blocks substantially the one or more of the blue, green and red light while passing infrared light and a second filter can block substantially infrared light while passing the one or more of the blue, green and red light. In a first operating mode, the MEMS positions the first filter, but not the second filter, over the selected sensor to filter light before the light contacts the selected sensor and, in a second operating mode, the MEMS positions the second filter, but not the first filter, over the selected sensor to filter light before the light contacts the selected sensor.

In some embodiments, the microsensor array is interfaced to a typical digital system, that reads and stores the data into a digital storage (memory) for subsequent processing, the whole operation being under the control of a microprocessor (a CPU).

The present disclosure can provide a number of advantages depending on the particular aspect, embodiment, and/or configuration. The image processing system can be applied to make a sensor array sensitive with its full resolution of microsensor to more than one type of data. Full resolution means that every pixel is used in the measurement of the incoming data.

CERTAIN DEFINITIONS

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any storage and/or transmission medium that participate in providing instructions to a processor for execution. Such a medium is commonly tangible and non-transient and can take many forms, including but not limited to, non-volatile media, volatile media, and transmission media and includes without limitation random access memory ("RAM"), read only memory ("ROM"), and the like. Non-volatile media includes, for example, NVRAM, or magnetic or optical disks. Volatile media includes dynamic memory, such as main memory. Common forms of computer-readable media include, for example, a floppy disk (including without limitation a Bernoulli cartridge, ZIP drive, and JAZ drive), a flexible disk, hard disk, magnetic tape or cassettes, or any other magnetic medium, magneto-optical medium, a digital video disk (such as CD-ROM), any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored. Computer-readable storage medium commonly excludes transient storage media, particularly electrical, magnetic, electromagnetic, optical, magneto-optical signals.

The terms "determine", "calculate" and "compute," and variations thereof, as used herein, are used interchangeably and include any type of methodology, process, mathematical operation or technique.

The term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

The term "module" as used herein refers to any known or later developed hardware, software, firmware, artificial intelligence, fuzzy logic, or combination of hardware and software that is capable of performing the functionality associated with that element.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below. Also, while the disclosure is presented in terms of exemplary embodiments, it should be appreciated that individual aspects of the disclosure can be separately claimed.

Image Processing System

In some embodiments, the apparatuses, devices, and systems described herein include an image processing system, or use of the same. The image processing system comprises a sensor array able to measure more than one type of measurement. This capability is realized by many different techniques. In various embodiments, the sensor array contains more than one type of microsensor coupled with a microelectromechanical system (MEMS) that allows this sensor to acquire the data as if it is formed of a single type of microsensors. In some embodiments, the MEMS moves the entire sensor array; in other embodiments, the MEMS moves one or more elements of the sensor array. The elements include one or more selected sensors and/or one or more light filters positioned above one or more selected sensors (or above the entire array). The movement of the mechanical parts of this image processing system is generally a function of the layout of the different types of microsensors in the sensor array. As used herein, a sensor and microsensor are used interchangeably.

With reference to FIG. 1, a multiplicity or array of microsensors is arrayed in the form of a rectangular layout, though any geometrical pattern may be used. A first set of microsensors (labeled as 1 and 2) is sensitive to a certain type of data, e.g., if the data are optical, then it is sensitive to light in a certain wavelength, while the other second set of microsensors is sensitive to another type of data, or another band of light. This embodiment does not depend on what type of data the multiplicity of microsensors is measuring. The concept can be applied to any array of microsensors, that traditionally was measuring one type of data. By adding to the array another type of microsensors, the microsensor array can measure another type of data. As will be appreciated, more than two types of microsensors can be added to any array to measure more than two different types of data.

With continuing reference to FIG. 1, the array has a certain number of microsensors along its width, W microsensors, and a certain number of microsensors along its height, H microsensors, and the microsensors are interlaced at a pitch of two in both the horizontal and vertical directions (as shown in FIG. 1, where it is labeled "horizontal pitch" and "vertical pitch"). These W and H dimensions and pitch define the direction and the magnitude of motion that the micro-electrical mechanical system must exert in order to make the microsensor array measure both types of measurements without sacrificing the resolution of the measurement of either. In other words, the number of microsensors measuring each type of data are the whole number of microsensors (W×H).

The Array of Microsensors

Figure 2:
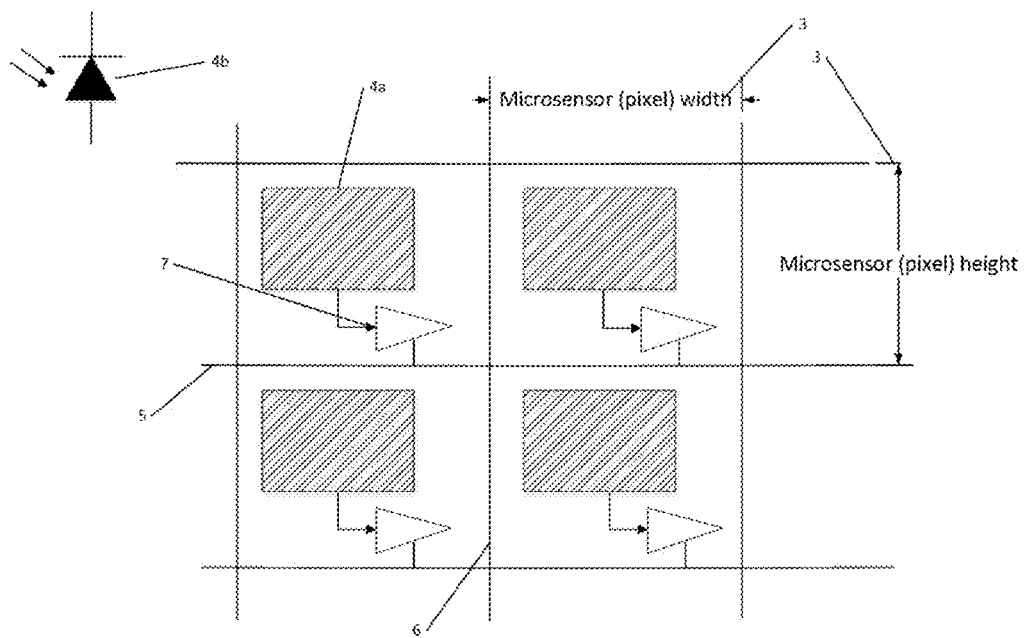
FIG. 2 depicts a portion of the microsensor array; in this case, a portion of an array of microsensors with photosensitive area is, in accordance with embodiments.

A general description of the array is depicted in FIG. 2. It shows the concept of the microsensors, and their arrangement in the form of a two-dimensional array. FIG. 2, shows a portion of that array which is formed of first, second, third, and fourth microsensors. Each of first, second, third, and fourth microsensors has a specific height and width as defined by grid lines. A portion of this area is the specific portion which converts light to electricity; this area is labeled 4*a* and 4*b*. The ratio between this area and the area of the microsensor (which is the width times the height), is called the fill factor of the microsensor (the pixel fill factor). Therefore, when the light falls on each of these microsensors, the light is converted to an electrical signal that is read-out as an analog value. The choice of the microsensor whose value is to be read out is done by choosing the row, labeled 5, and the column, labeled 6, that circuitry of this microsensor is connected to. This value is amplified via an amplifier, converted to a digital value, and stored in a memory for later use in a digital computing and processing system (not shown).

The teachings of this disclosure apply equally to the sensor array configured as a CCD or CMOS and hence, the design of this circuitry constitutes no bearing on the embodiments described in this disclosure. As will be appreciated, the two main approaches in manufacturing light-sensitive sensor arrays are CCD (Charged-Coupled Devices) or CMOS (Complementary Metal Oxide Silicon). The access to the pixel is different in both cases. In the case of CCD, the resulting voltage results from a charge that is stored in the circuit elements of the microsensor and is fully "coupled" to the neighboring pixel whose charge in turn is moved to its neighboring pixel, and so on until the whole row is read out; hence, the name Charged-Coupled Devices (CCD). In CCD the pixels are readout sequentially and cannot be read at a random order. In contrast, in CMOS any pixel can be accessed at random by choosing its row and column and reading the voltage value of that pixel.

Figure 3:
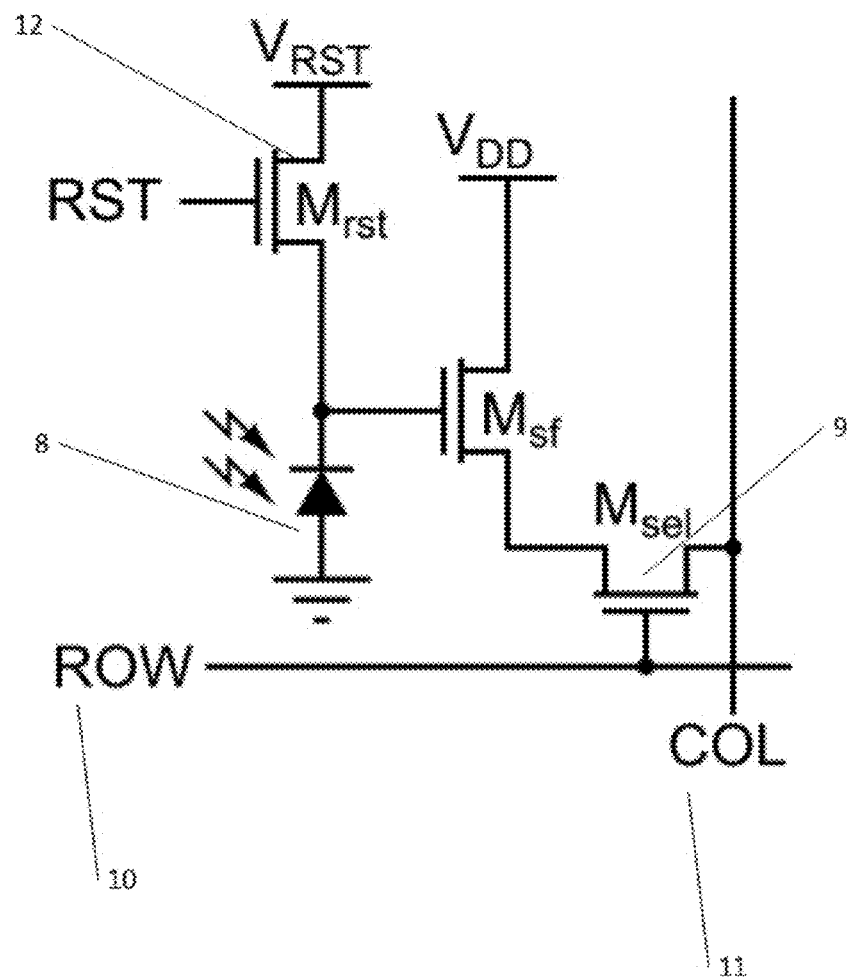
FIG. 3 depicts an exemplary implementation of a CMOS microsensor array, in accordance with embodiments.

In case of CMOS sensors, an embodiment of the circuitry that constitutes each one of these microsensors is depicted in FIG. 3. Where the light falls on the photosensitive element, it is responsible for converting the light signal falling on the microsensor into an electrical voltage, the size of this element as it is being laid out in the circuitry is what defines the fill factor of the pixel. The value of this voltage is read-out, if the ROW and COLUMN (COL) of this particular microsensor (pixel) are selected. The ROW and COL are selected via external circuitry called row and column decoders (which are building blocks of the whole array sensor). The mechanism of reading out of the value of the electrical charge depends on the sensor being CCD or CMOS. The read-out mechanism has no implication or limitation on the embodiments of the disclosure.

Because CMOS sensors are replacing CCD's in the field of imaging, read-out will now be explained for CMOS sensors. The electrical charge is read out of this specific type of microsensor when the ROW (10) and COL line (11) are activated by the external digital circuitry that operates the array. The external digital circuitry are called the row and column decoders. The activation of the specific ROW and COL of a microsensor allows the charge collected by the diode to be read-out via the element Msel (9). The microsensor is reset in preparation for the next measurement via the RST signal (12).

There are assistive tools that assist microsensors, specially optical ones, to gather optical (light) data. Examples of such assistive tools include: the lens assembly, microlenses, and optical filters which block certain types of wavelengths, and those which admit certain types of wavelengths. These filters can play an important role to make a microsensor able to measure one type of data or another.

Example of Lens Assembly

Figure 4:
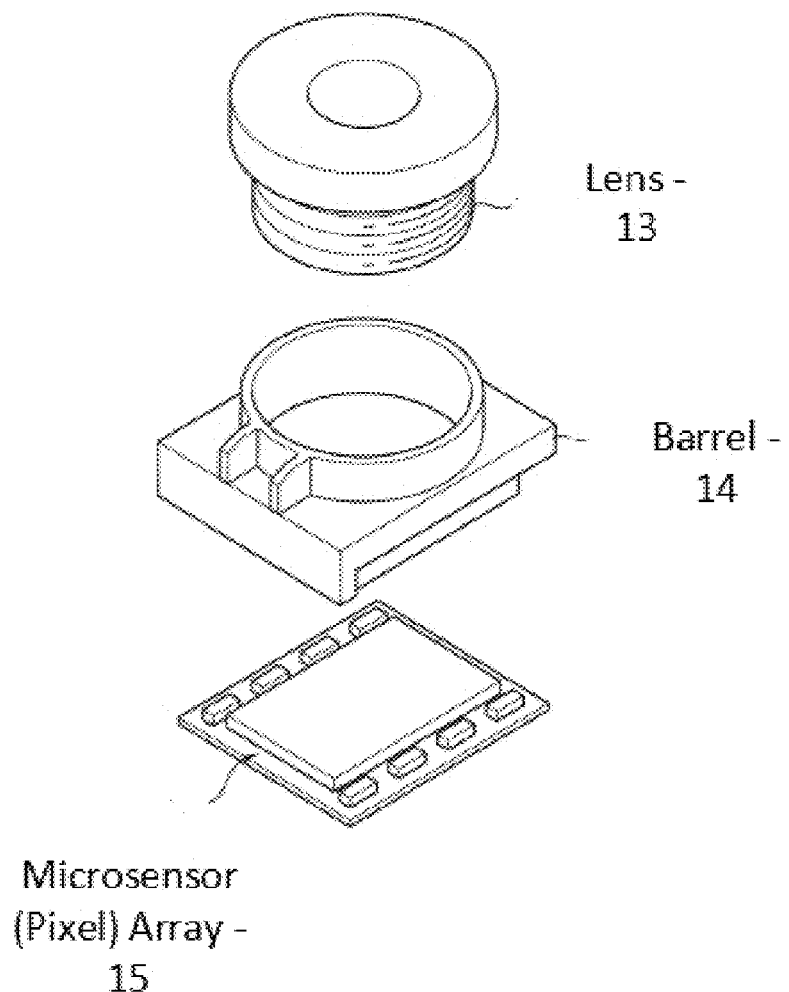
FIG. 4 depicts a microsensor array, in accordance with embodiments.

For maximum optical coupling, i.e. to collect maximum amount of optical data, the pixel array can be covered with a lens assembly as depicted in FIG. 4. The mechanical components of the lens assembly include an optical lens. The lens is housed, usually screwed in (to be used for focusing the picture), in a barrel, that in turn covers the pixel array. The light that falls on the pixel array generally comes only through the lens. The center of the lens can be at the center of the pixel array. As will be appreciated, this cannot be guaranteed to be perfect, hence it is one of the parameters of a camera calibration process that is well-known in the field of computer vision.

Microlenses

Figure 5:
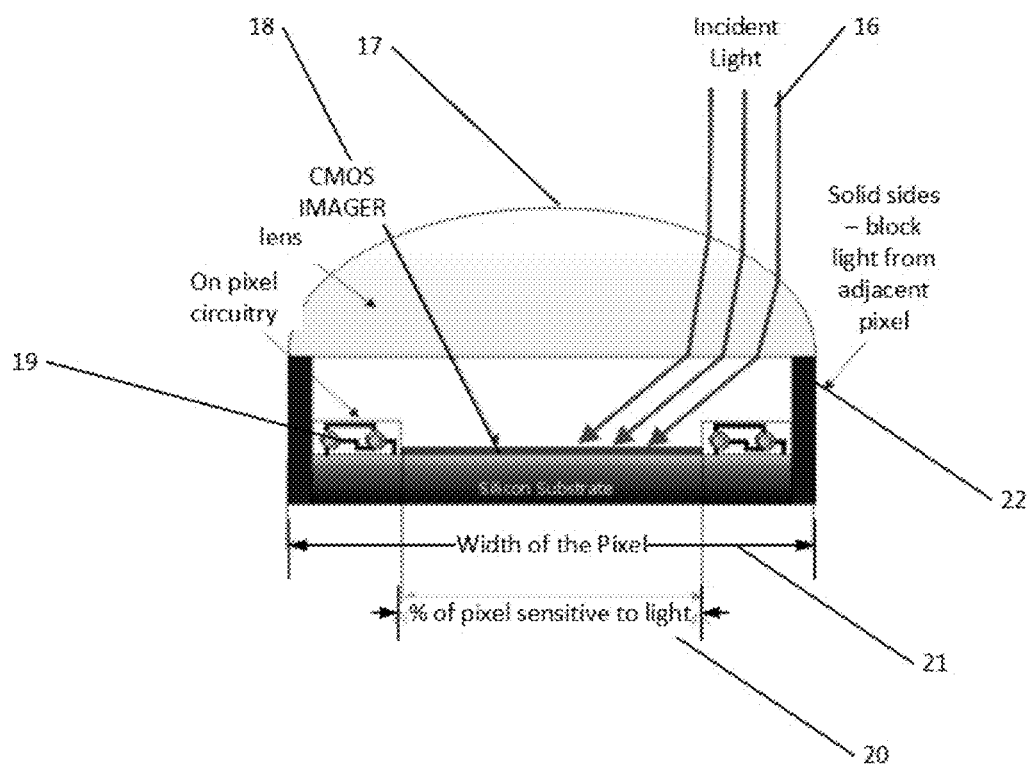
FIG. 5 depicts a microlens cross-section, in accordance with embodiments.

A microlens, as the name implies, is a structure that is put on every microsensor (pixel). It is a lens that typically covers one pixel only. Microlenses can increase the amount of light gathered on each pixel itself, hence increasing the ability of the corresponding sensors to gather more light and therefore work at low light environment. Hence, microlenses can increase the signal-to-noise ratio of each pixel. FIG. 5, shows a cross-section of a microlens. The light falls on a convex surface of the microlens. The convex surface collimates the light to fall onto the photo-sensitive area of the microsensor (pixel), which is electrically a photo-diode as explained above. The supportive electronics to collect the electrical signal resulting from the light is also shown. The fill factor is also depicted as the width of the area sensitive to light to the width of the whole pixel. Additionally, in order for the light not to leak from one pixel to another, solid sides are built around the pixel, and is depicted.

Microsensors and Collecting Different Types of Data

Figure 6:
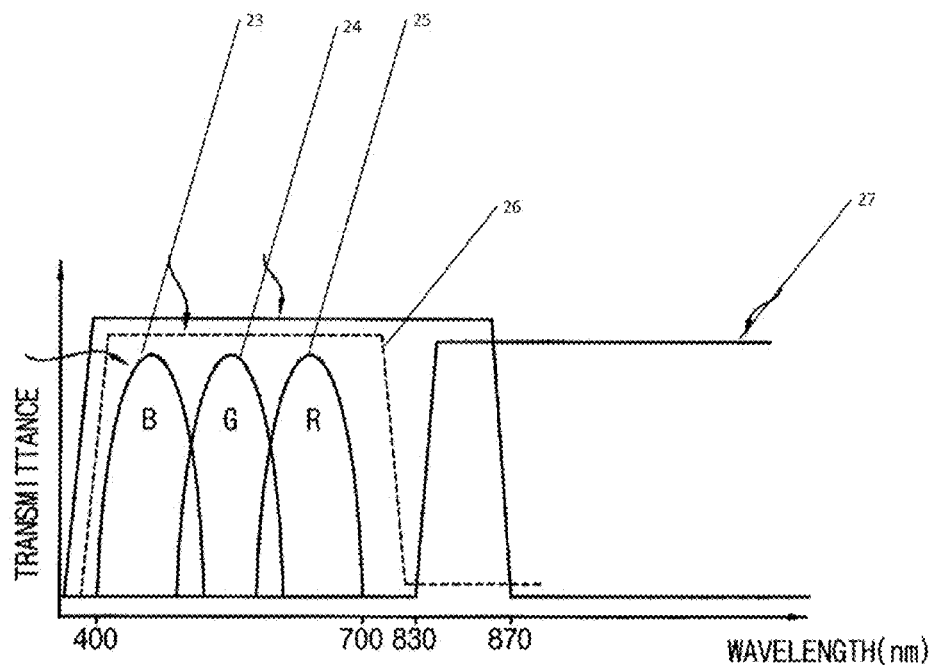
FIG. 6 is a graph of transmittance (vertical axis) against wavelength (nm) (horizontal axis) depicting color filter and infrared rejection and admittance, in accordance with embodiments.

To make a microsensor (a pixel) sensitive to one type of data while blocking the other type of data, optical filters are employed to admit the data that is required or desired while blocking the data that is not required or desired. By way of example, when the required or desired data are visible image data (as type 1 data), and the undesired data are infrared (IR) data (as type 2 data), the filters are used whose responses are depicted in FIG. 6. FIG. 6 shows the transmittance responses of filters that are applied to a selected pixel to receive and sense type 1 data while rejecting (or failing to sense) type 2 data or vice versa.

To receive type 1 data and reject type 2 data, the filters used to make the microsensor able to receive light in the Blue, Green, or Red wavelength range, while rejecting the light in the Infrared range, have admittance responses (for the set of filters to admit Blue, Green, and Red, respectively). The filter needed for rejecting the infrared light has admittance response looking like the curve. It is worth noting that the IR filter can be a "coating" on the microlens itself.

By contrast to receive type 2 data and reject type 1 data, the filters used to make the microsensor are able to receive infrared light only, while rejecting the visible light wavelengths, admit the infrared light and conceptually looks like the filter with the admittance response.

Embodiments Using the Field of Imaging and Computer Vision

In the embodiments of imaging and computer vision, there are typically two different types of measurements that need to be measured; hence, there are normally two types of microsensors (pixels) that are needed to measure these types of data. One type of microsensor is made sensitive to visible light, and the other type of microsensor is sensitive to infrared (IR) wavelength. This is particularly beneficial in the context of developing a sensor array to be used in cameras that acquire images as well as depth data. However, the methodology explained here can be applied to make a sensor array sensitive with its full resolution of microsensor to more than one type of data. Full resolution means that every pixel is used in the measurement of the incoming data. Two different types of data are selected to be measured to be related to the field of imaging and computer vision. And these two types of data are visible light intensity and infrared light intensity or, for short, video data and infrared data.

Imaging has traditionally acquired images and presented the images with the highest quality to the users. Digital cameras replaced film due to a plethora of reasons, mainly ease of use, looking at the image before taking it, ease of erasing and re-snapping the image, and, above all, having the image in a digital format to be directly used by a computer system that employs the images and/or video clips in different software programs that further add value to these images.

Computer vision has become a field that is integral to different imaging applications running on several devices that are used daily. Computer vision goes to the next step after imaging, which is using the information in the image to achieve different tasks defined by the user. For example, computer vision applications find faces (e.g., facial recognition) in the images and finds task-relevant objects to modified or augmented (such as in augmented reality). A prime example of these systems are the Human Natural User Interfaces (HNUI). These interfaces are used in many devices that are becoming more and more adopted by users.

Depth measurement is often vital to computer vision systems and has in fact been the holy grail of computer vision research. Many tasks of computer vision required depth information of the scene that the camera is aimed at. Multiple-camera systems, mainly stereo vision (Stereo-vision is when two cameras are being used) has taken the lion share of this research, but it had some drawbacks, system complexity by having two cameras and the more difficult ones are the correspondence problem and the occlusion problem. The first one is the problem of matching a region or a point in one camera image to the same point in the other camera image. This problem becomes increasingly complex with more than two cameras. Occlusion is the problem of not having the other point in the other camera to begin with, because from the angle of the other camera it is being occluded by another object in the scene.

Confronted by these obstacles in relying on stereo computer vision algorithms to find depth, other methods have emerged employing projecting a priori known light patterns (visible or invisible to the human visual system) on the scene, and taking images of the scene to analyze the deformation and size, among other properties of these patterns being imaged by cameras, to extract information about the depth of every point of the scene. It is better to use invisible patterns to compute the depth so that they do not appear in the traditional images. For if the system were to be used for industrial applications, it would not matter for the pattern to be visible or not, because these systems are mainly concerned with quality control of the produced products. But if the system were to be used in systems acquiring traditional pictures or video, it is generally not acceptable to see light patterns on the scene. The most commonly used wavelength spectrum for these systems is the infrared wavelength spectrum. The camera that grabs regular video will be referred to as a video camera, or video sensor, or video imager, while the camera that grabs the infrared spectrum will be referred to as the infrared camera, or infrared sensor, or infrared imager.

The Image Processing System for Sensing Data

To create an image processing system that measures more than one type of measurement, a separate sensor is employed for every type of measurement. For example, if one captures visible light (digital cameras being prime examples) then there is a single sensor array that is retrofitted with the appropriate filters to capture just visible light (usually in the color bands Red, Green, and Blue).

Figure 7:
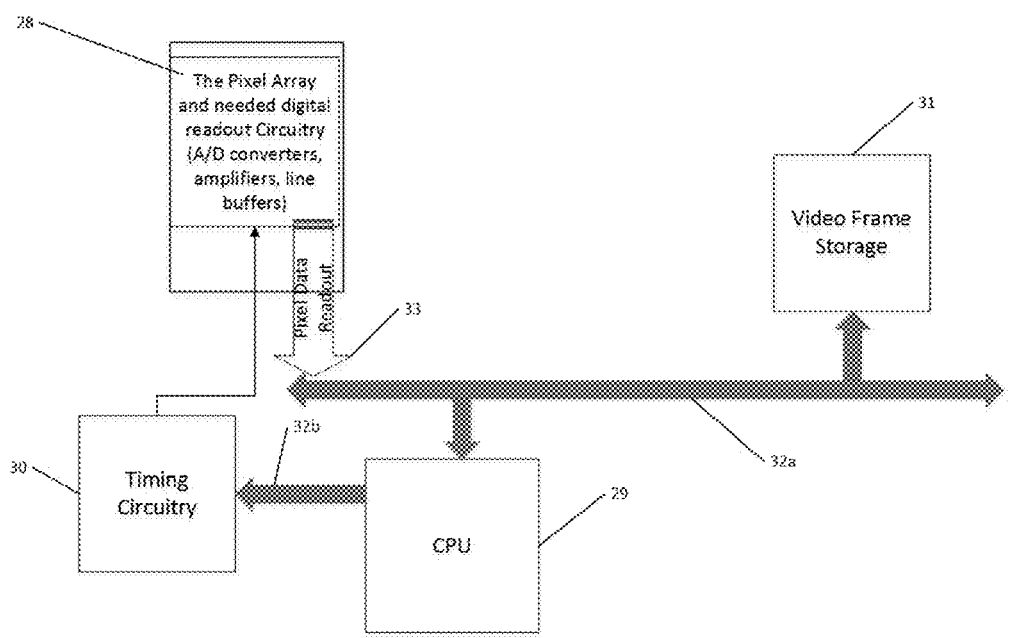
FIG. 7 depicts an image processing system, in accordance with embodiments.

FIG. 7 shows a system that captures visible light to present it in a two-dimensional array. The basic idea of such systems, is to "sense" the environment using the two-dimensional array of microsensors under the control of a microprocessor, or central processing unit (CPU). The CPU typically programs different parameters on the sensor to make it more suitable to sense the data and also drives a timing circuitry, which triggers the two-dimensional array to snap a two dimensional array of data using the array of microsensors. The CPU then drives the timing circuitry to put the sensor array into the mode of reading out the dimensional data that it "sensed". This data are stored into storage memory for later usage by any application that would utilize the sensed data. The first sensory data are the visible data collected by the microsensor (pixels) of a camera. The storage memory is also referenced as video frame storage. Digital data are transferred from across different system components: namely the sensor array, the microprocessor, and the data storage elements (memory) via signal conductors which is also called in digital systems the data bus. The data are read out of the sensor array on the data bus via the signal carrier, which is the wiring that carries the digital data coming out of the sensor array. This is the basic functionality of a digital system designed to sense a single type of data. Obviously digital cameras have far more features and many controls to the sensor itself, but they can be readily implemented in the embodiments disclosed herein.

Figure 8:
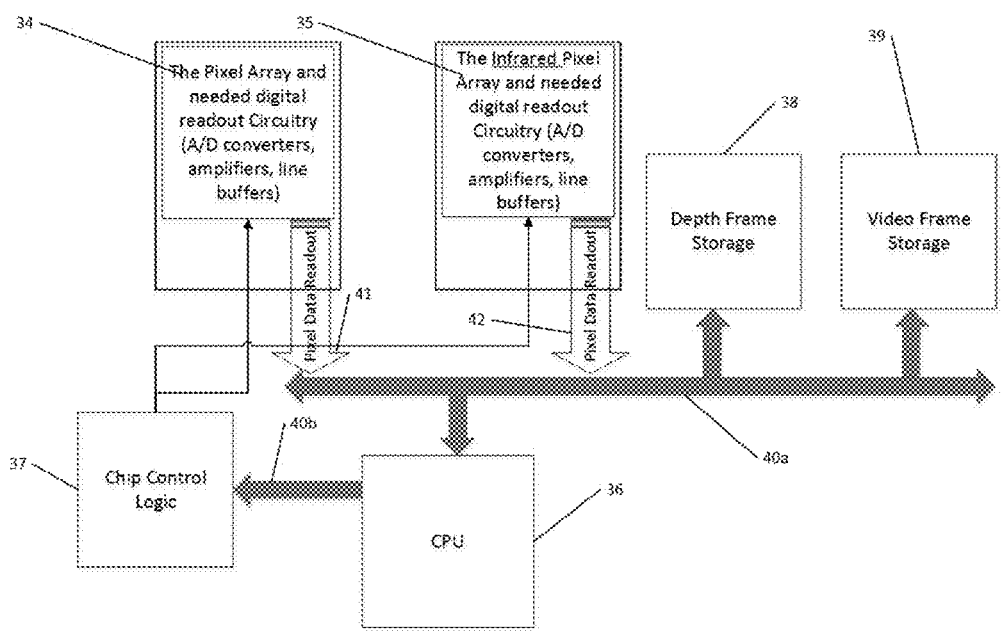
FIG. 8 depicts an image processing system, in accordance with embodiments.

To expand the digital system to measure another type of data, another sensor array is employed. This is shown using FIG. 8. For purposes of illustration, the other type of data are infrared data to be used to compute depth information of the scene. FIG. 8 contains a digital system that operates in a similar as the one depicted in FIG. 7 with the exception that the CPU send commands via the signal conductor to the timing circuitry (which is identified as chip control logic). The timing circuitry triggers the sensing of a second type of information using a second sensor array besides sensing the first sensor array, and storing it in different memory storage (shown as depth frame storage) so as not to overwrite the first type which is stored in memory storage (shown as video frame storage). The first data are read out from the first sensor array via the signal carrier, and the second data are read out from the second sensor array via signal carrier. The first and second data are transferred to the appropriate memory via the signal carrier. The example of the second data is infrared data of the scene which the two dimensional sensor array is looking at. An additional optical lens can be employed with infrared light signals to focus them on the two-dimensional microsensor (pixel) array (or second array) that is added to sense the infrared data. In essence, the separate arrays and define two cameras with two lenses in one assembly (which greatly reduces the compactness of the digital system).

Three-Dimensional Image Sensors and Methods of Manufacturing the Same

Figure 9:
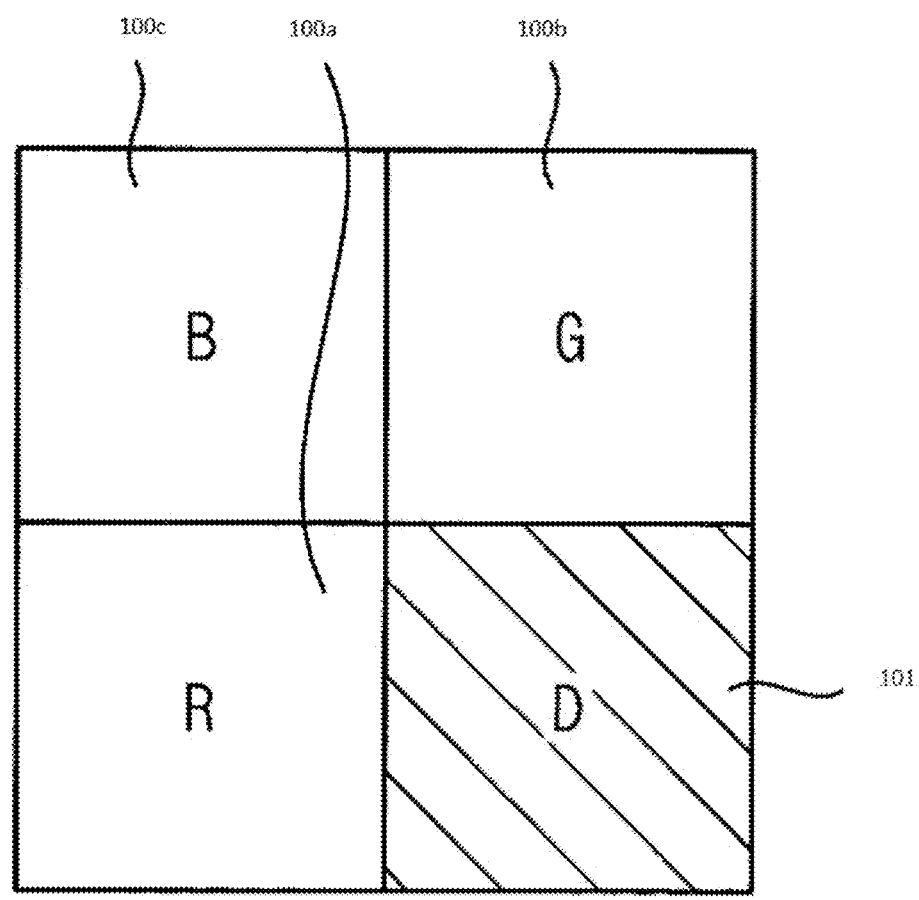
FIG. 9 depicts a four pixel arrangement, in accordance with embodiments.

In some embodiments, there is a depth pixel as the fourth one of the square formed by that pixel itself and other 3 pixels that are sensitive to Red, Green, and Blue colors, respectively, as shown in FIG. 9. The Fig. shows three pixels labeled R, G, and B, which are sensitive to the corresponding colors of red, green and blue, respectively, while the pixel labeled D is the pixel that measures the infrared signal from which the depth data will be later mathematically computed.

This approach will suffer the following drawbacks: the resolution of both measurements will lose resolution since the depth measurement pixels will remove some of the visible light sensitive pixel, the R, G, and B. Because the disclosed embodiment is a modification of the Bayer Pattern layout, the Red pixel is positioned under the Blue pixel while the Green pixel is removed from the second line. Because the Green pixels contribute most to computing the intensity Y (in the domain YCrCb, Intensity, Red Chroma, Blue Chroma, respectively), and also intensity is what defines the resolution of the picture (as opposed to the Chroma), this type of approach will suffer a drastic reduction in its resolution, which is the most important aspect of imaging: namely the sharpness of the image. This is such a damaging drawback, also the depth resolution will be poor to begin with because it will be one pixel every four (as seen in FIG. 9), i.e., one-quarter of the sensor resolution. In addition to those drawbacks, another defect is that this layout will damage the Bayer pattern layout. This necessitates the development of completely new routines to reconstruct the video image from the sensor array. The Bayer Pattern has become the standard for video processing from R, G, and B pixel arrays. Hence keeping it, allows the sensor to be readily used in almost any available image processing system. By contrast, the sensor assembly of the present disclosure can use substantially the full resolution of the sensor array and each sensor to measure both the depth, as well as the R, G, B signals. The sensor array and digital system of the present disclosure can also maintain the Bayer-Pattern layout, which makes the sensor array compatible with the image processing systems in the market. Most of the pixel processing hardware processes images out of CCD or CMOS Bayer Pattern imagers.

Systems that Offer Only a Depth Sensor

Systems that use only a depth sensor are, as noted, flawed. They do not offer video data and are merely "range" cameras. They typically include a light source, a detector, and a signal processor. The light source transmits a source signal to the target according to a transmit control signal having reference time points. The detector receives a reflected signal from the source signal being reflected from the target. The signal processor generates a plurality of sensed values by measuring respective portions of the reflected signal during respective time periods with different time delays from the reference time points. The signal processor determines a respective delay time for a maximum/minimum of the sensed values for determining the distance of the target. While the system of the present disclosure can be used as a range camera, it can perform a wide variety of imaging operations, including providing video data.

Three Dimensional Image Sensor

In some embodiments, the subject matter disclosed herein, the sensor array and imaging processing system of the present disclosure can achieve the visible light and the infrared measure using a single array, without sacrificing the resolution at which each is measured. This can enable the array to be positioned be on a single or common chip that can offer the major advantages of:

1—Compactness, hence amenable to miniaturization of the system they are employed in.
2—Ease of system integration into other larger systems
3—Solves the problems of correspondence and occlusion which arise from measuring with two different sensors.
4—Accurate depth and video data matching due to the physical maximum proximity between pixels (in embodiment 1) and the use of the same pixels for both, image and depth (in embodiment 2) due to the measuring of the data by the two types of pixels being at the same location, in embodiment 1 by moving the sensor pixel array, and in embodiment 2 by moving the filters that cover the pixels. Hence virtually there is no difference between in the localization of the image and depth sensing data.
5—One set of intrinsic camera parameters due to the use of one array, and one lens.

Description of the Image Processing System of the Present Disclosure

This description can be divided into two main parts:

A—The microsensor array design and the different approaches used
B—The digital circuitry The Microsensor (Pixel) Array and the Different Approaches to the Layout Design of the Array:

The microsensor or pixel array is the heart of the sensor that, coupled with the microelectromechanical system (MEMS), measures multiple data types. Although the system is discussed with reference to only two data types, the system can be easily expanded to measure more data types. The exemplary two data types used in this discussion are video data as well as IR data. The latter type of data can, using mathematical algorithms, be converted to depth data.

There are two main philosophies in achieving the system pixel array with the surrounding supporting circuitry that can deliver multitype sensory data:

The first approach uses geometrical interlacing arrangements between type 1 microsensors; namely, image visible light pixels and type 2 microsensors (e.g., the infrared pixels). This is known as space-multiplexing, where the image sensor real-estate is shared between type 1 microsensors (image pixels sensitive to visible light) and type 2 microsensors (infrared light sensitive pixels). In this case and as discussed below, the micro-electrical mechanical system (MEMS) will move the whole sensor array in a direction and with a magnitude that is a function of the geometric interlacing pattern.

The data output in this approach is a mix of type 1 data and type 2 data.

The second approach uses the whole sensor array to be a type 1 data (image) sensor and also the whole array as type 2 data (IR/depth) sensor. This is frame or time multiplexing. In this approach, MEMS are used to cover each sensor of the array with filters appropriate for the measurement. For type 1 data, the MEMS move a first filter stack on the microsensor that allows type 1 data to be measured and block type 2 data from measurement. In the other mode, the MEMS allows another second filter set to be on top of the microsensors that allows type 2 data to be measured. The second filter set may block from measurement all or part of the visible light spectrum. There are two different embodiments to achieve this approach.

The data output can be either all type 1 or all type 2 data or both type 1 and type 2 data. The whole array in a frame acts as an infrared receptor, and in another frame as a visible light traditional visible light camera sensor. Thus, in a first frame, infrared light is collected and, in a second frame, visible light is collected, or vice versa.

The details of embodying these two design philosophies will be explained later.

In the following section, an embodiment of a digital system is depicted in which the new pixel array system comprises the components of a single-chip sensor.

The Image Processing System

The previous approaches to the sensor array are embodied in a digital system, which has also other supportive circuitry components to achieve the implementation of the approaches as well as provide the functionality needed to make the sensor able to deliver video and depth data. An example embodiment of the pixel array and supportive circuitry is explained using FIG. 10. The lens is positioned above the image processing system and gathers and directs the optical signal to the whole array. The system represents the components that would be on a common chip or circuit board.

The pixel array is where a multiplicity of microsensors are arranged to achieve the measuring of more than one type of data. There is more than one approach to design the layout of the microsensors. These approaches will be explained later.

The read-out is performed differently for CCD and CMOS technologies. When the sensor is a CCD technology the read-out decoding logic drives row and column circuitry that causes each row to transfer its charge from one pixel to the next till the whole row is read out. Hence this read-out decoding login manages the sequential read-out of the array values. By contrast when the sensor is CMOS technology, the row and column decoders rather than read-out logic, select the pixel(s) whose data are to be read out, which read out can be sequential or random. The read-out sequence and the storage of the data in memory in done in a way that maintains the order of the data will be explained later in connection with the implementation of the design approaches mentioned above. A correlated double sampling (CDS approach is commonly used in reading data out in CMOS sensors).

The analog gain circuitry amplifies values as the analog value of each pixel is read-out.

The analog to digital converter converts the pixel analog data into a digital value, and the digital gains circuitry applies a multiplication factor to the pixel data that is read-out. This module can be present on the chip or implemented in other parts of the system. The digital data can be stored in a register prior to reading it out to the rest of the system via the digital bus.

The Micro-electro Mechanical System (MEMS) includes MEMS controller/circuitry in signal communication with the actuators to move the array. The MEMS can be an important component of the chip. The MEMS moves different parts of the chip to achieve a goal of the image processing system, which is measuring more than one type of data with a single sensor, both at the full spatial resolution of the sensor. Depending on which design approach is implanted in the sensor array, the MEMS will move different sets of parts. MEMS controller/circuitry provides the control to the electromechanical actuators. The actuators are commonly divided into two blocks logically because physically they may be one block on the chip.

The chip control logic receives data from the CPU (not shown) to program how the whole image processing system and its component parts (including the MEMS and sensor array) will operate, via the module Array Operation Logic. Examples of such parameters are: the exposure time of the sensor array to gather a selected type of data (which may vary by type of data to be collected), the gains applied by the analog and/or digital gain circuitry to amplify the collected sensor data, the speed of clocking the sensor array (which may vary by type of data to be collected), and so on. Other important information can include: the timing to drive the MEMS to move the actuators to synchronize with grabbing or collecting the data and the timing and type of IR light pattern to project on the scene. The MEMS motion of the sensor is explained below in connection with the different approaches of designing the sensor array or image processing system. Also the concept of using IR light patterns to recover depth information will be explained below.

The digital storage and its access can be any type of computer readable medium located on or off the chip or both. This is a system design issue and does not affect the functionality of the sensor array, provided that the design is done with major consideration to the speed of reading out the data from the sensor array. Storing the data in the memory can be done by the microprocessor (not shown), which would read out every digital data of every pixel and store it into a digital storage, or by having a "Direct Memory Access" (DMA) digital block that off-loads the collected digital data from the register.

The wiring (the bus), that carries the sensed information or data in and out of the chip, transfers the data from the CPU (not shown) to the internal digital blocks (not shown) of the image processing system, which controls the image processing system's different operations. The wiring also carries the data being read out from the sensor array, via the digital output lines labeled, to the appropriate digital storage block (digital memories).

Other components play a role in receiving depth-related data from the sensor array, which is used to compute the depth data of the scene or image. These components are infrared (imperceptible) light pattern emitters that will project these patterns outwards onto the scene or image. For achieving maximum system integration, the light-pattern emitter(s) can be integrated on the same chip.

There proposed embodiments of the two approaches are discussed below in more detail.

The First Approach of Implementation (the First Embodiment)

The image processing system includes a (micro)sensor array where there is a mix between type 1 and type 2 microsensors, e.g., between regular visible color-selective pixels (sensitive to Red, Green, and Blue) as well as infra-red sensitive pixels. The pixels are located on a common substrate, preferably in an interlacing pattern. The interlacing pattern can be in the rows or in the columns, or in both.

Figure 11:
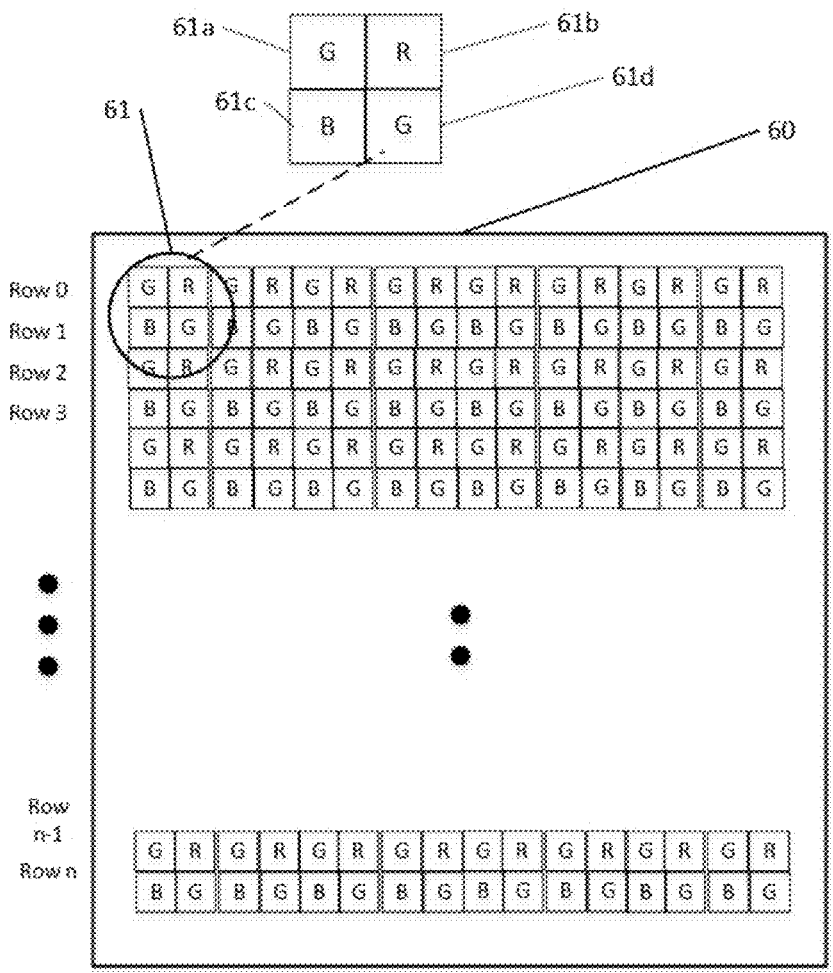
FIG. 11 depicts a layout of color filters, in accordance with embodiments.
Figure 12:
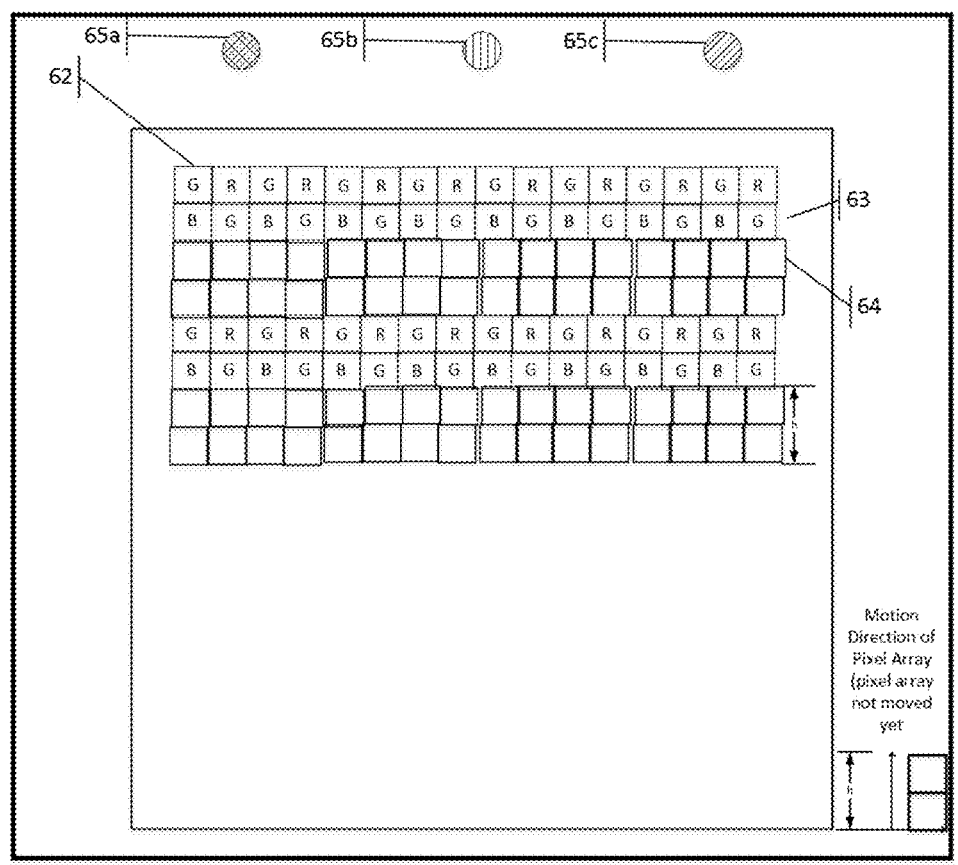
FIG. 12 depicts an interlaced row of visible light-sensitive and infrared-sensitive pixels, in accordance with embodiments.

An embodiment of such an arrangement is seen using FIGS. 11 and 12. First, in FIG. 11 a layout of microsensors (pixels) is depicted that are sensitive to type 1 data only, the visible light, where the microsensors are covered with color filters to make each pixel sensitive to one type of color only. The sensors are located on a common chip or substrate. In a selected portion of the array, first and second sensors and are sensitive to GREEN light, a third sensor to BLUE light, and a fourth sensor to RED light. The shown pattern is known as Bayer pattern, which is the most widely used pattern in color imaging sensors.

FIG. 12 shows how the sensor array shown in FIG. 11 is converted to sense more than just the visible light. This is done by interlacing the pattern of microsensors that are sensitive to type 1 data (the visible light BLUE, RED, and GREEN sensitive pixels) with microsensors that are sensitive to type 2 data, namely the infrared light (IR), where the interlacing is done in the rows. Thus, the rows represent the Bayer pattern while intervening rows are sensors sensitive to type 2 data. Thus, there are two types of interlacing, a first is interlacing between BLUE, GREEN and RED light sensitive pixels and a second is interlacing between BLUE, GREEN and RED light sensitive pixels on the one hand and type 2 data, or infrared, sensitive pixels on the other.

The manufacturing of the sensor array follows the common way of manufacturing CMOS cameras, hence it will be straightforward for current CMOS manufacturers to produce such a sensor. This manufacturing process includes the following steps:

(1) All microsensors (pixels) are manufactured in a similar layout, (2) A—Color filters (with the visible light filter admittance response shown in the FIG. 6, labeled B, G, and R) are applied to the pixels in FIG. 11 that will be used for visible light sensitivity in RED, GREEN, and BLUE. In the current embodiment, the pixels are applied to row 0 and row 1, as Green and Red interlacing pixels on row 0 and Blue and Green interlacing pixels on row 1, then skip row 2 and row 3, and then applied to row 4 and row 5 similar to row 0 and row 1 respectively, and so on till the end of the array.

(3) B—An IR blocking filter is applied, on those rows that will be sensitive to visible light, namely: rows 0, 1, and row 4, 5, . . . in the current embodiment, as they are shown in FIG. 12.

(4) The other rows, row 2 and row 3, and then row 6 and row 7, and so on . . . will be the IR sensitive pixels, where the IR blocking filter and the color filters are NOT applied. In FIG. 12.

(5) Microlenses increase the amount of light gathered on each pixel itself. They are applied on each pixel of the whole pixel array to increase the light-gathering efficiency of each pixel.

The sensor can be used in this fashion, sacrificing half of the vertical resolution of collecting both type 1 and type 2 of data. The present disclosure overcomes this problem by using MEMS to move the sensor up (the direction in which any resolution is lost, in this case, it is in the vertical direction but can be in another direction depending on the application) by a distance equal to the length dimension of two pixels, along the same direction (in the case shown in FIG. 12 the distance in the vertical dimension of the pixel (relative to the plane of the page) is labeled "h"). It is to be appreciated that the distance "h" is not limited to the length dimension of two pixels but can be one or more than two pixels depending on the application. The MEMS design is straightforward since it can effect the motion of the array in only one dimension. As will be appreciated, the distance and direction of motion of the sensor array is a function of the interlacing pattern of the different types pixels that gather different types of data. The present embodiment shows interlacing only in the vertical direction (in the plane of the page); however, the present disclosure can be easily extended to interlacing horizontally (in the plane of the page). In that case, the sensor array is moved horizontally (in the plane of the page). It can also use interlacing in both the vertical and horizontal directions (relative to the plane of the page) in which case the sensor array is moved in both the vertical and the horizontal directions (relative to the plane of the page).

Stated another way, at a first time and in a first operating mode all or part of the pixel array is in a first position. In this position the pixel array reads both type 1 and type 2 data in the certain spatial position as shown by the spatial layout of the microsensors. At a different second time and in a second operating mode, all or part the pixel array is moved by the MEMS to a second position different from the first position. In this position, the pixel array reads still both types of data, type 1 and type 2. When the all or part of the sensor array is moved up to position 2 so as to reverse the locations of collecting type 1 and type 2 data, hence there is no loss in the spatial resolution of both type 1 and type 2 data measurements.

In another configuration, at a first time and in a first operating mode all or part of the pixel array is in a first position. In the first position, the type 1 data sensitive pixels are positioned to collect type 1 data while the type 2 data sensitive pixels are positioned so as not to collect type 2 data. In this position, the type 1 data are read out of the type 1 data sensitive pixels. In another embodiment, the type 2 data sensitive pixels can collect type 2 data in the first operating mode.

At a different second time and in a second operating mode, all or part of the pixel array is moved by the MEMS to a second position different from the first position. In the second position, the type 2 data sensitive pixels are positioned to collect type 2 data while the type 1 data sensitive pixels are positioned so as not to collect type 1 data. In this position, the type 2 data are read out of the type 2 data sensitive pixels. In another embodiment, the type 1 data sensitive pixels can collect type 1 data in the second operating mode.

Figure 13:
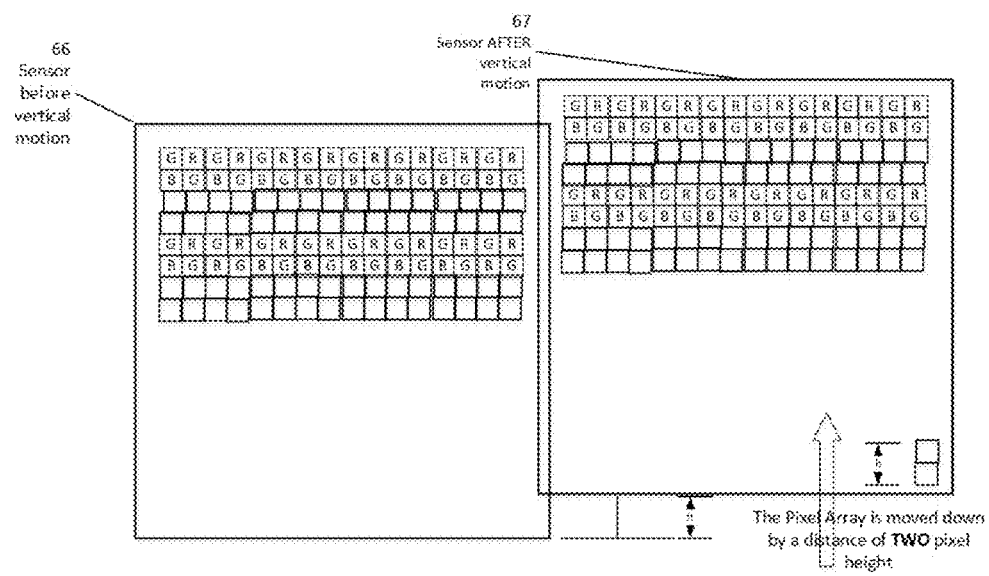
FIG. 13 depicts an interlaced row of visible light-sensitive and infrared-sensitive pixels according to the present disclosure and before and after movement by the MEMS, in accordance with embodiments.

This is demonstrated by FIG. 13, which also shows how there is no loss in the special resolution of the measurements. FIG. 13 shows the pixel array depicted in FIG. 12 with the whole array before motion (the left array) (or when the array is in the first operating mode and in the first position) and after being moved up by a distance that is equal to the interlacing amount (which is two rows) by a distance equal to the vertical height of two pixels so that the pixel array is in the second operating mode and in the second position.

From the interlacing pattern and the motion of the sensor it can be appreciated that the data taken from the two positions of the sensor will complement one another to create a full resolution of type 1 of data video data as well as full resolution of type 2 of data infrared data. This sequence of data acquisition can be further explained as:

Sequence of Operation of the Pixel Array in this Approach:

The operation of image acquisition in the current embodiment is explained only in the case of pixel layout shown in FIG. 2, where the interlacing is done in the vertical direction (in the plane of the page) but the operation is identical for the horizontal direction (in the plane of the page). The operation can be logically extended in any other pattern of interlacing.

Figure 10:
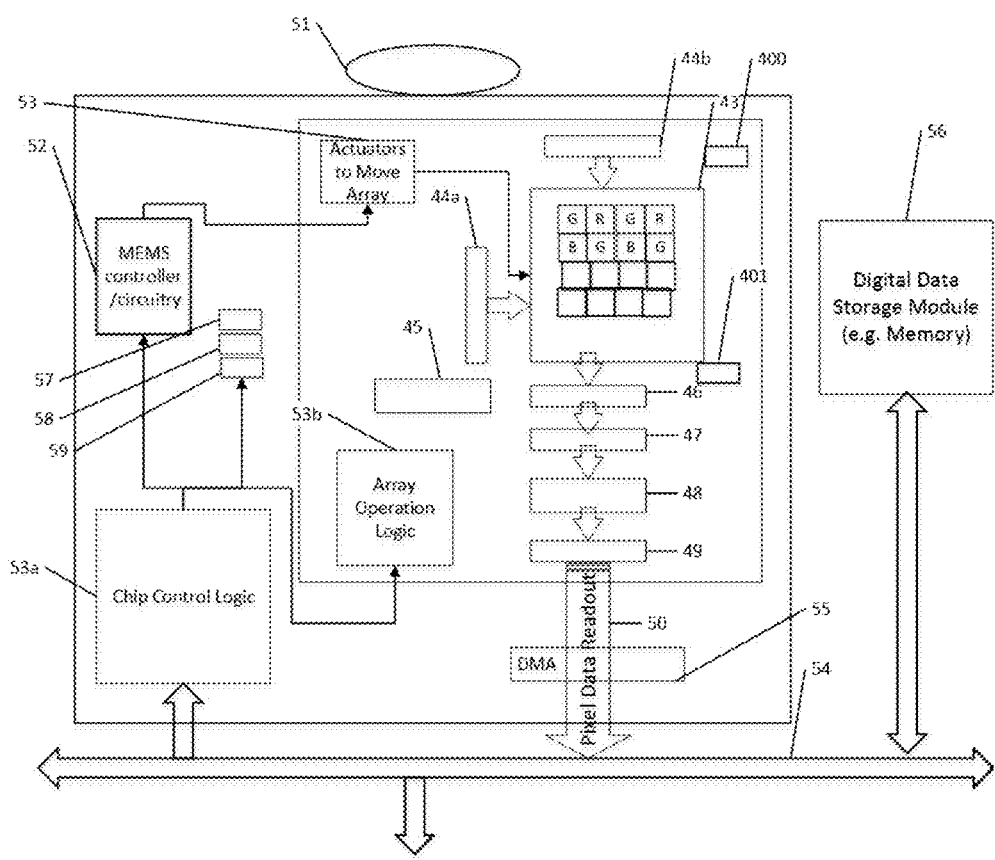
FIG. 10 depicts an image processing system, in accordance with embodiments.

In the current implementation where the interlacing of image pixels and infrared-sensitive is done along the vertical direction (in the plane of the page), the sequence of operation image acquisition of the sensor is outlined as follows:

1—A frame (or frame A) is captured, and is read-out and stored in memory (the storage operation is explained in the previous section as is shown in FIG. 10).

2—The sensor array is moved up (in the plane of the page).

3—Another frame (or frame B) is captured, and is read-out and stored in (the storage operation is explained in the previous section as is shown in FIG. 10).

4—The data from both frames are used to generate a full frame of type 1 data (visible image frame to be used in the video processing), and a full frame of type 2 data (infrared frame to be used in the depth calculation).

5—steps 1-4 keep repeating as long as the image processing system is operated to gather these two types of data.

In the following section, the mechanism of the digital storage of the mixed types of data that will be output from the sensor is explained.

Reading and Storing the Mixed Data

Figure 14:
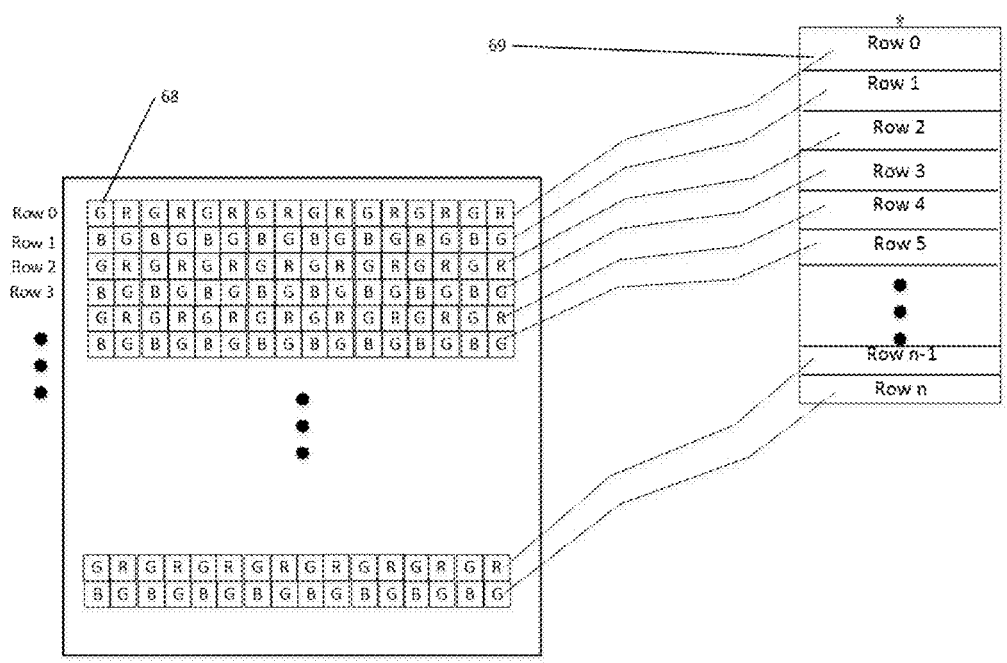
FIG. 14 depicts a method of writing a sensor array data in memory, in accordance with embodiments.

When the data are interlaced in this fashion, the type 1 and 2 data must be stored in memory in a different way, so that in the end, type 1 data and type 2 data are stored contiguously and sequentially together as if the two types of data are coming from two different sensors and in the correct order of the rows. First, it is important to understand how the data are sequentially read out and stored in case of a traditional array of microsensors, i.e., which measures a single type of data. FIG. 14 shows the storage of a single type of data coming sequentially along each row from an array of a single type of microsensor. The data are stored digitally in a digital storage one row after the other (with each row stored as one pixel after the other usually from the left of the array to the right). Row 0 is followed by row 1, then row 2 till row n, which is the last row to be read out from the array. So the data of the same type is stored contiguously. In the present disclosure, it is desirable to achieve the same outcome with the storage of more than one type of sensed data. That is data of type 1 (video data) is stored all together and that of type 2 (IR data) is also stored all together contiguously. The method of achieving this will now be explained using FIGS. 15 and 16.

Figure 15:
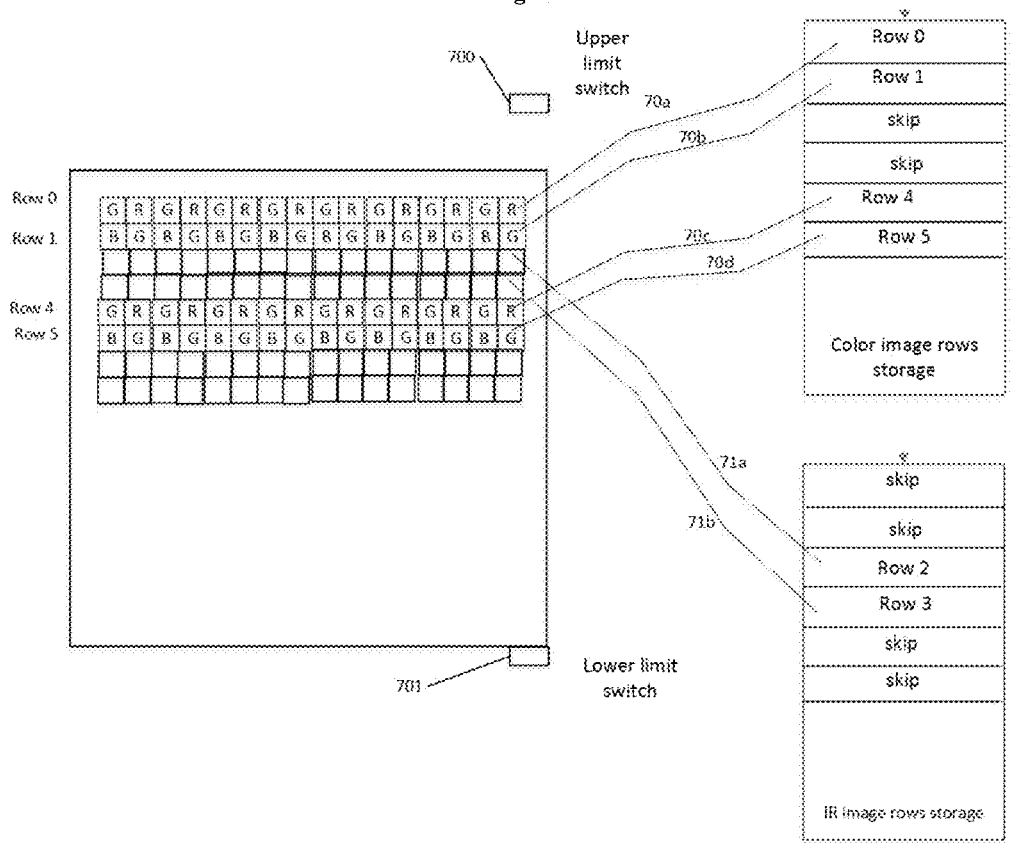
FIG. 15 depicts a method of writing a sensor array data in memory, in accordance with embodiments.

Referring to FIG. 15, the data coming out of the microsensor array is sequential; that is, the data are read out from the sensor pixel-by-pixel in one row, then pixel-by-pixel in the next row, then the next, and so on until the end of the array. Hence, the data read out from the array is a mix of both type 1 and type 2 data. Namely, the read out data are two rows of video data, and two rows of IR data. Using simple digital logic circuitry, the data are directed to be stored in different and/or separate storages, one for type 1 and the other for type 2; e.g., the type 1 data are stored in a video data storage area and the other in an IR data storage area. This has to happen while preserving the order of the data of each type. This is achieved as depicted in FIG. 15 as follows: the type 1 data of row 0 and row 1 is stored in the type 1 storage memory (the video memory as shown by transactions and in FIG. 15). After storing rows 0 and 1, skip in memory enough space to store row 2 and row 3 of the same type of data (e.g., video data) because it is NOT there yet (it will be available after MEMS moves the sensor array to the second position and grabs another frame of measurement). Then, rows 4 and row 5 are stored in the type 1 memory storage (as shown by transactions). But rows 2 and 3 are the type 2 of data; hence, the type 2 data are stored in the other storage memory (the IR memory) after skipping in memory enough space to store rows 1 and 2 of the same type of data (e.g., IR data) because it is NOT there yet (it will be available after MEMS moves the sensor array to the first position and grabs another frame of measurement). After storing tows 2 and 3 (as shown by transactions), skip in memory enough space to store rows 4 and 5 of the same type of data (e.g., IR data) because it is NOT there yet (it will be available after MEMS moves the sensor array to the first position and grabs another frame of measurement). Then, rows 6 and 7 from the current frame are stored in type 2 memory storage, and so on.

Figure 16:
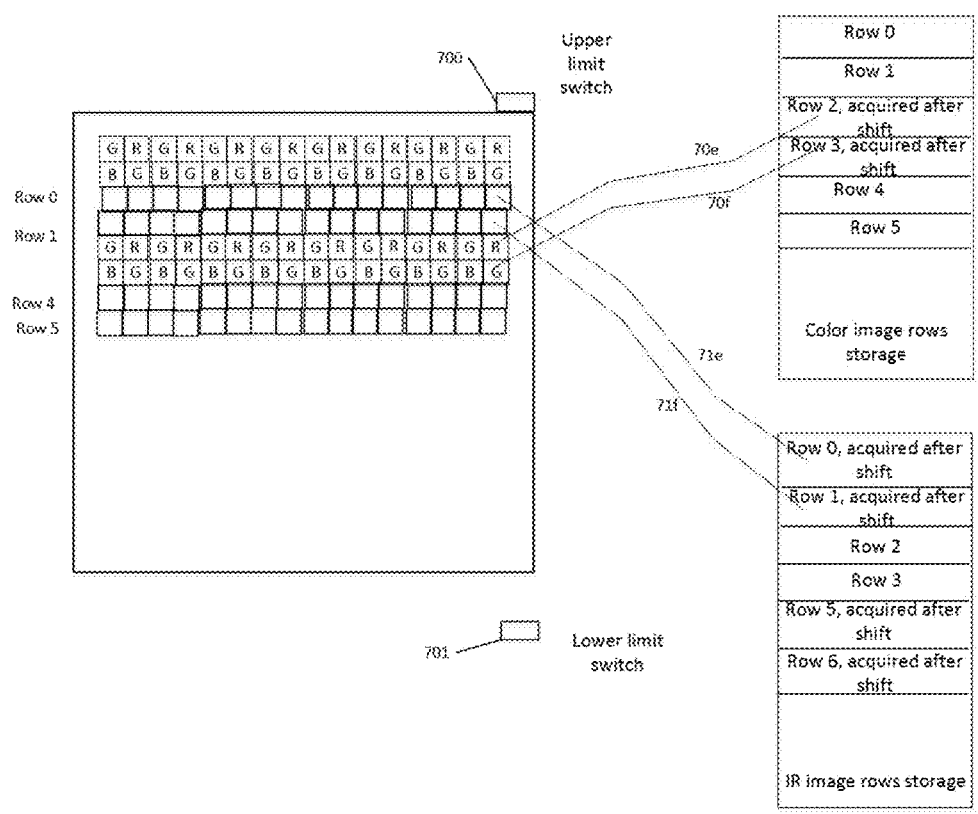
FIG. 16 depicts a method of writing a sensor array data in memory, in accordance with embodiments.
Figure 17:
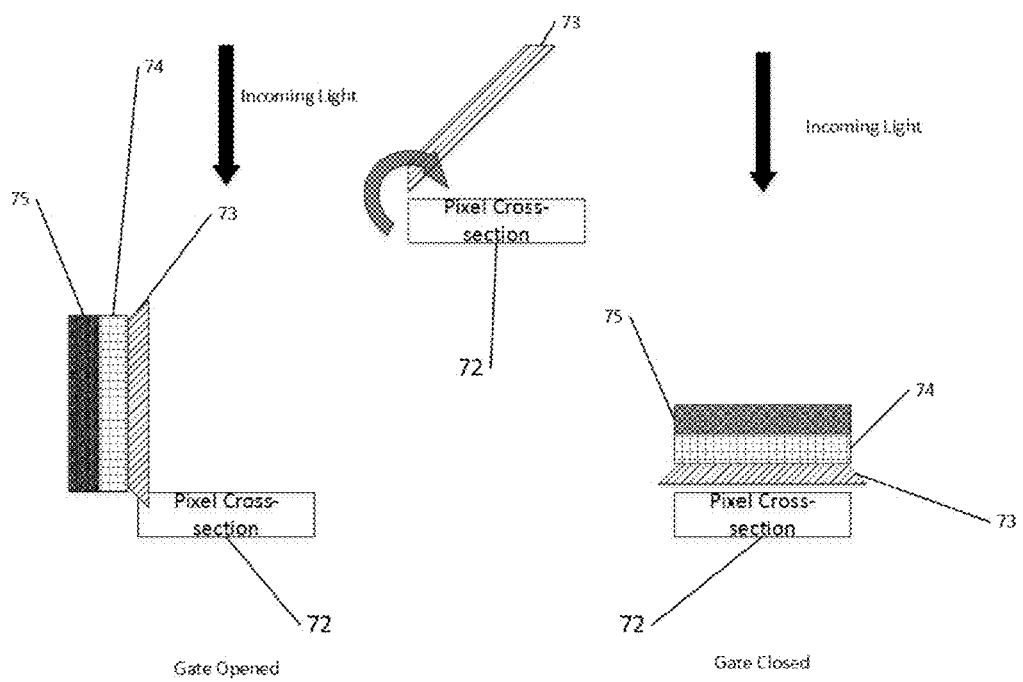
FIG. 17 depicts a light filtering gate, in accordance with embodiments.

When the sensor is moved to the second position, as shown in FIG. 17, and another set of data are collected, row 4 and row 5, which are physically located after motion up by two rows in the location of row 2 and 3, are now used to store the missing video data of row 2 and row 3, as shown by transactions, respectively. In this case, rows 0, 1, and 4 and 5 are of type 2 of data, and they are stored in their appropriate location as shown, for the type 2 data of rows 0 and 1, by transactions in FIG. 16. The same concept is applied to the whole sensor array vertically.

At the conclusion of this process, all type 1 data are stored contiguously in one memory (e.g., color image row storage), while all type 2 data, the full resolution of the sensor, are stored in the memory (e.g., IR image rows storage).

The pixel layout can be changed depending on the applications. For example, the interlacing can be done along the horizontal direction, in other words, there is one column of color-filter covered pixels, and the next column is infrared-sensitive pixels. The sensor pixel array, in this case is moved along the horizontal direction by an amount that is equal to the horizontal length of the pixel.

Along the same idea, different pixel patterns can be also implemented sacrificing the resolution of one type of measurement compared to the other (for example having high resolution of the video data versus the depth data). For example, if it is preferred that the sensor to have better resolution is for the video data while the resolution of depth data is sacrificed, two rows of the infrared-sensitive pixels can be used for every four rows of color-filter-covered pixels. In that event, the pixel array is moved along the vertical direction by two pixels, hence, the full Bayer Pattern is reconstructed while missing two rows of the vertical resolution of the infrared data. The same approach can be applied by having the interlacing done in the horizontal direction. As will be appreciated, there are different combinations that the sensor and system architect can implement. But the teaching of the present disclosure remains the same: that is, the teaching is to interlace the microsensors and move the sensor to covered the interlaced area ("interlace and move").

In many embodiments, the movement and the stoppage of the array is guided by limit switches, labelled 400 and 401 in FIG. 10. They operate on the such that when the image array is moved, the end of its travel is sensed when it causes these limit switches to change their state, from example from OFF to ON (or vice-verse), in order to signal that the array has reached its final destination. This allows the actuating circuitry that moves the array to halt its operation. At this point the array is stationary in its new position. Each of the limit switches is coupled to corresponding circuitry in order to transmit signals from the limit switch to the circuitry in order to store data of the sensor array according to the configuration of the sensor array.

Each of the limit switches is configured to transmit a signal to the circuitry to indicate the change of state of the limit switch. When the sensor array arrives at a first position, the limit switch transmits a first signal to the circuitry to indicate that the sensor array comprise a first configuration. When the sensor array arrives at a second position, the limit switch transmits a second signal to the circuitry to indicate that the sensor array comprises a second configuration.

In accordance with the embodiments of FIGS. 15 and 16, the array in its lower position comprises a first configuration of the sensor array, as the sensor array is in contact with the lower limit switch (in FIG. 15, labelled 700). When the sensor array has moved to the upper position, sensor array comprises a second configuration, in which the movement of the sensor array has been limited upon contact and actuating the upper limit switch (in FIG. 16 labelled 701). In many embodiments, the limit switches provide a signal to the circuitry upon the sensor array reaching a desired location, which is marked by the position of the switch. In accordance with many embodiments, the limit switch may comprise more than two limit switches, for example with embodiments in which the array is stopped the array in more than two locations.

The Second Approach of Implementation (the Second and Third Embodiments)

Unlike the first approach, the second approach uses the same microsensor to measure different types of data; that is, the same pixel measures both visible and IR data. This can only achieved by preparing the pixel with the appropriate filters that admit a certain type of data and blocks the other type(s), and then changing it to admit the another type, and blocking the first.

This is achieved using the MEMS to cover each pixel with the filters that convert back and forth from being an infrared sensitive pixel to a visible light pixel.

In this approach, each pixel itself is covered with a microlens, but not with color filters, IR admittance, or IR blocking filter.

In the infrared or second operating mode the pixel is exposed to incoming light without the interference of any filter in its path (obviously except for the camera lens). In the visible light or first operating mode the MEMS actuates a gate that has on it the IR filter and the appropriate color filter for every pixel (Red, Green, or Blue). In FIG. 15, this concept of the image sensor array is shown using the cross-section of one pixel.

Each pixel has a photo-electric area which is in charge of collecting incoming light and converting it to an electric signal that is a function of the intensity of that light. A side or cross-sectional view of this area is shown in FIG. 17. A cross-section of a light filtration assembly or "gate" (a rectangular or a square structure), which carries on it, the IR blocking filter and a visible light admittance filter (in one of Red, Green, or Blue depending on the pixel) can be rotated to a gate open position to subject the pixel to incoming light or a gate closed position to remove IR and certain visible light spectra from the light impacting the pixel. In the gate opened position (shown on the bottom left), the pixel will be sensitive to infrared light, whereas in the gate closed position (shown on the bottom right) the pixel will act as an image pixel that is sensitive to desired wavelength spectrum of visible light, which is one of Red, Green, or Blue, depending on the color filter used for this particular pixel. A layer of a transparent material (can be glass) is laid on top of the door before putting the IR and the color filters. This layer is put to support both the IR and the color filter due to the fact that the light filtration assembly is opened from the middle so as to let the light through when it is in the closed position (shown on the bottom right).

Figure 18:
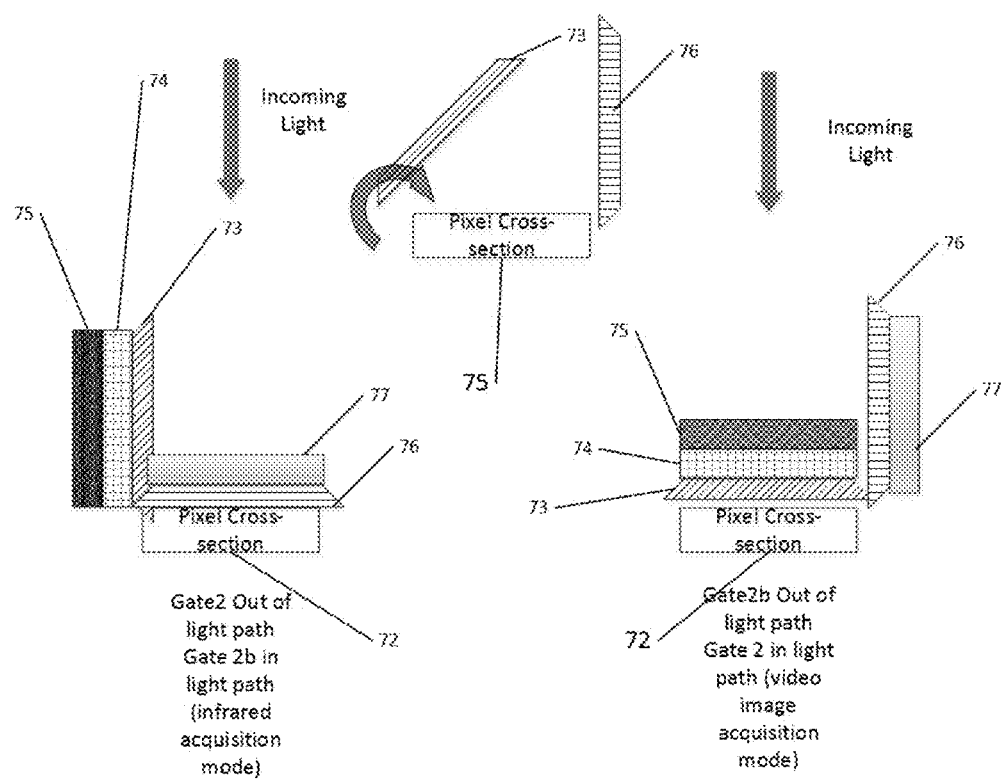
FIG. 18 depicts light filtering gates, in accordance with embodiments.

FIG. 18 depicts, a second embodiment, a more complicated variation of the gate approach, where two gates are used so that an IR admittance filter is applied to the pixel when it is in the mode of acquiring infrared light. In FIG. 18, there are two gates in the top center of FIG. 18. When the camera is acquiring a video image (in the bottom right of FIG. 18), gate is closed and another gate opened to take the infrared admittance filter "out of the way" and have the color filters and the infrared blocking filter in the way of the light hitting the pixel. When the camera is put in the mode of acquiring an infrared image, then the opposite is done, namely the gate is rotated out of the way while the gate is rotated or closed to have the IR admittance filter in the way of light hitting the pixel, as shown in the bottom right of FIG. 18.

Another, third variation, of this embodiment is making the gates large enough to cover the whole pixel array as opposed to a pixel-by-pixel basis. Where there can be two gates of the same concept as gates made of glass, or they can be rectangular frames covered with a plane of glass (depending on feasibility of manufacturing), and they can close or open on the whole pixel array. Compared to a gate on every pixel, this solution is simpler, but it may suffer from larger inertia required to open and close the gates and will require vertical room above the pixel array to accommodate the opening of the gate which is now as high as the pixel array and as long (or as wide) as the whole pixel array, depending along which side it opens and closes.

Both approaches can provide a full resolution Bayer Pattern of visible light R,G,B pixel array, as well as a full-resolution infrared sensitive pixel array. Therefore:

1—The Color Filter pattern is still preserved as a Bayer-Pattern, hence all of the already available pixel processors software and hardware will be compatible with this image/depth sensor. This is a major advantage since the Bayer-Pattern processing is extremely mature and is almost the standard in image processing systems for CMOS (as well as CCD) cameras. The current embodiments however can be applied to any pattern, and also it is worth noting that the R,G,B light admittance filters can be any other triplet of color filters (such Cyan, Magenta, and Yellow, or others) as long as their combination can provide all the color, including white.

2—In the first approach, where the whole sensor is moved, there is limited deviation from the regular manufacturing of regular CMOS video sensors. Hence, current technology is readily mature to implement this first embodiment readily. Also the required motion from the MEMS is straightforward.

Computing Depth from the Infrared Measurement

What the present disclosure means by infrared measurement is the use of light, or rather structured light patterns, whose wavelength falls in the infrared light spectrum. And the reason for that is to avoid interference between these light patterns with other "perceptible" or "visual" imaging functionality, such as image acquisition, so that these lights do not "appear" in the acquired image. Structured light is the process of projecting a known pattern of pixels onto a scene. These light patterns can be in the form of shapes lines, grids, and/or circles. The way that these deform when striking surfaces allows vision systems to calculate the depth and surface information of the objects in the scene. Or these shapes can be in the form of functions, such as light intensity grading in the form of a sinusoidal function or a square function, with different frequencies. The change of the "phase" as detected by the sensor from that of the projected light is a function of the depth of that point in the scene. There are multiple publications that cover these algorithms and different enhancements of it. In the present embodiment here, any of these algorithms can be employed. Humanly invisible (or imperceptible) structured light uses light that has wavelengths that would not interfere B—the Embodiment of a Digital Circuitry with the Pixel Array The present disclosure has covered the different approaches for designing a single pixel array system-on-a-chip to achieve measuring more than one type of data with the same array. Now an example embodiment of this "chip" will be shown. The present disclosure has further explained the methodology of storing the data out of the sensor into the memory when the data are a mix of the two types of sensed data. An embodiment of a digital system that implements the above is described below.

The pixel array simultaneously measures more than one type of data (visible light which is used to form video image and infrared light that is used to compute the depth measurement). The array can be implemented in any of the different embodiments explained above. The pixel array with the MEMS are encapsulated together on a single chip. The image processing system operation is controlled by the processing unit called the Image Processing Unit. The Image Processing Unit puts the image processing system in the first operating mode of composite type 1 data (e.g., the visible data mode) and type 2 data (e.g., the IR mode) sensing or the second operating mode (by moving the array) of the composite type 1 data and type 2 data sensing. Or in another embodiment, sensing type 1 data in a certain mode, while sensing type 2 data in another mode. The Image processing system mode is controlled by the Central Processing Unit (CPU) in FIG. 7. The CPU also drives the Timing Circuitry in FIG. 10 (via the wiring bus in FIG. 7), which triggers the timing to the two-dimensional array image sensor to "sense" the scene (snap the image). After that the timing circuitry drives the sensor array to read-out the data gathered in the microsensors (pixels) over the read-out bus from the sensor array. The data can be of type 1 and of type 2 or of both together (depending on the approach used for the sensor design). The data of both types (pixel data) are then processed by the CPU and the memory to be gathered to be stored in their appropriate corresponding storage of type 1 data (memory) and type 2 data (memory).

The data are not stored in a mixed fashion, although in one of the embodiments discussed herein they are collected in a mixed fashion. Type 1 data (e.g., video data) are stored in video frame storage area, whereas type 2 data (e.g., the IR data) are stored in depth frame storage area). Now, the image processing system can generate type 1 data, a video image, or type 2 data, IR image (depending on the operating mode in which the array is in), and the image is stored in a corresponding area (video memory for video mode, and depth memory for depth mode), both to be used later in applications. The CPU can be also a pixel processor that achieves all the processing of video and IR. In case of the video processing of the Bayer pattern, pixel interpolation is used by the CPU to compute color components RGB for each pixel. Other operations include, without limitation, digital gain, white balance, color space conversion (from RGB to YCrCb), and gamma correction. In case of infrared data processing, the CPU performs, but not limited to, data noise removal and pattern deformation recognition and depth data and/or object shape recovery. The CPU can use the IR image to calculate the depth data (using well-known publicly available algorithms) and store it in the depth frame storage or it can be passed to other applications that will run on the systems that will comprise the embodiments herein. The data transfer between modules is carried out using digital bus(es). Bus is used to read data out of the sensor and bus to write data to the sensor. In digital logic terminology, a bus is a multiplicity of wires on which digital data get transferred in a digital system from one digital circuitry to another in the system.

To collect useful IR data that will be used to compute depth, the image processing system projects one or more light patterns on the scene. Hence the image processing system can have one or more infrared light emitters. The IR emitters can be placed all around the pixel array. Also each emitter can project a different pattern, which is used in depth measurement. The light pattern is projected onto the scene, the reflection of the pattern from scene is received by the pixel array and with different computing algorithms, depth data of the scene is computed. Preferably, the light pattern is not visible to the user; otherwise, the scene will be filled with "artificial" light patterns that appear to the user, which would greatly interfere with the traditional image snapping and grabbing that the user is familiar with. The scene should therefore be void from anything visible that interferes with the scene, and hence will be recorded in the image that the user is grabbing.

As mentioned, the MEMS makes the sensor array of the present disclosure capable of collecting different types of data using the same microsensor (pixel) array. The image processing system achieves the measurement of those different types of data by moving certain parts of our sensor array system. In the different embodiments, the MEMS moves one or more components which can differ depending on the configuration of the image processing system. The MEMS, however, is implemented in all of the embodiments to achieve the goal that the same sensor array can deliver two different types of data, which has been described as a video image, and an IR image.

Figure 19:
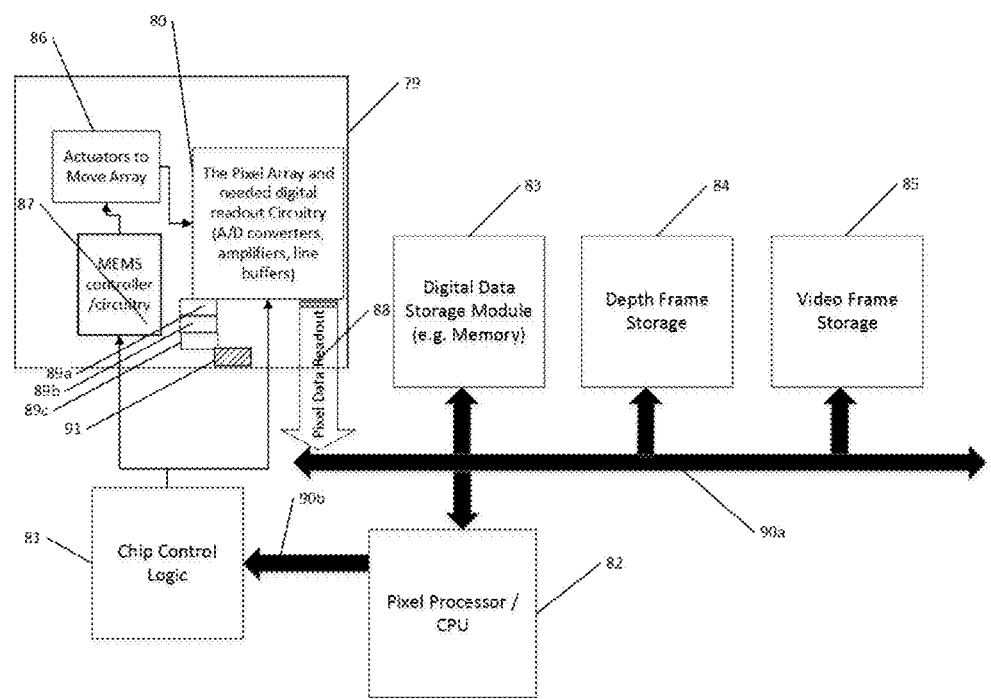
FIG. 19 depicts the image processing system, in accordance with embodiments.

Other Sensory Components on the chip can be, but not limited to:
A—Infrared Emitters with different patterns, which are depicted as the three circles on top of the sensor array in FIG. 10 (and shown also in FIG. 17). There is virtually no limit on their numbers and there is no limitation on which wavelength band and distribution they work in as long as they are visible by the infrared microsensors and invisible to the regular visible light microsensors (the color image pixels).
B—A MEMS microphone array on the chip
C—X-Y-Z Accelerometers and X-Y-Z gyros
D—A strobe light i.e. flash (in FIG. 19) to assist in improving the quality during acquiring images Applications:

Due to its high integration and the advantages of having a single chip solution to imaging and depth capturing, the proposed image processing system on a chip can be used in, but not limited to:
1—Gaming; high integration by having a single chip that emits the light and acts as both depth and video sensor, enables any video camera in a system to be replaced with our invention. This facilitates integration of 3D imaging applications on practically all computing and communications devices.

2—Human user interfaces for computing and communication devices, where it can replace all the cameras on laptops and mobile devices and surface-interaction computing pads. This will give rise to novel applications where there our device can be used as an image sensor, or a depth sensor, or both.

3—Augmented Reality applications will be greatly facilitated to be coded on mobile devices, tablets, and laptops due to the presence of a 3D camera on the device. This is because 3D data, video data are integrated into a single sensor. In Augmented Reality applications these data (video and three-dimensional data of the scene, which are already spatially congruent together because they are coming from the same sensor), are integrated with three-dimensional graphics that are suited for different applications: video gaming, education, training, and marketing)

4—Security/Surveillance where 3D tracking of perpetrators is achieved, which can create novel algorithms.

5—3D printing, the current sensor can be interfaced via a digital system that comprises hardware and software to print 3D data which acquired by the sensor and processed to recover the 3D data from the measurements and send it to the printer.

The exemplary systems and methods of this disclosure have been described in relation to microsensor arrays. However, to avoid unnecessarily obscuring the present disclosure, the preceding description omits a number of known structures and devices. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a camera or other imaging device, or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a server, in one or more computational devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

For example in one alternative embodiment, the sensor array of the present disclosure can be used for patterns other than the Bayer pattern.

In another alternative embodiment, the sensor array remains stationary while light one or more light filters are moved over the array to cause collection of the desired type of data. For example, in a first mode type 1 data are collected from the pixels in the presence or absence of a light filter to remove type 2 data and in a second mode a filter to remove type 1 data while passing type 2 data are moved into position by MEMS over the array to collect type 2 data.

In yet another embodiment, the sensor array is moved and has different light filters positioned over one or more pixels in the array depending on the operating mode. This embodiment is, effectively, a combination of the embodiments of FIGS. 13 and 17-18.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script or compiled software in a language such as C++ as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. An apparatus comprising:
   (a) a sensor array comprising a plurality of Bayer patterns disposed on a first plurality of pairs of adjacent linear arrays to sense Bayer pattern data, a second plurality of pairs of adjacent linear arrays having different patterns located between the first plurality of pairs of adjacent linear arrays to sense a different type of data;
   (b) an actuator to move the sensor array from a first position to a second position, wherein physical positions of the first plurality of adjacent pairs of linear arrays alternate with physical positions of the second plurality of pairs of adjacent linear arrays;
   (c) circuitry coupled to the actuator and the sensor array to output the Bayer pattern data and the different type of data from each of the first position and the second position; and
   (d) a first limit switch to signal when the sensor array is located in the first position and a second limit switch to signal when the sensor array is located in the second position, wherein the circuitry is configured to integrate first composite data of the sensor array in the first position in response to the first limit switch sensing the sensor array moving into the first position and integrate second composite data of the sensor array in response to the second limit switch sensing the sensor moving into the second position.

2. The apparatus in claim 1, wherein each pixel of the Bayer pattern data is output associated with the first position or the second position and wherein each pixel of the different type of data is output associated with the first position or the second position.

3. The apparatus in claim 1, wherein the different pattern comprises one or more of an infrared filter pattern, an ultraviolet filter pattern, a non-Bayer visible light filter pattern, or a pattern comprising no filter.

4. The apparatus in claim 1, wherein each of the pairs of the first plurality of pairs of the adjacent linear arrays comprises two adjacent pairs and wherein each of the second plurality of pairs of adjacent linear arrays comprises two adjacent pairs of linear arrays.

5. The apparatus in claim 1, wherein each of the pairs of the first plurality of pairs of the adjacent linear arrays comprises three or more adjacent pairs of linear arrays and wherein each of the second plurality of pairs of adjacent linear arrays comprises three or more adjacent pairs of linear arrays.

6. The apparatus in claim 1, wherein circuitry is configured to generate the Bayer pattern data from the first composite data and the second composite data and to generate the different type of data from the first composite data and the second composite data.

7. The apparatus in claim 1, the circuitry comprising instructions to move the sensor array to the first position and measure first data of the sensor array in the first position and move the sensor array to the second position and measure second data of the sensor array in the second position, the processor further comprising instructions to provide a first full frame image from the first plurality of pairs of adjacent linear arrays having the Bayer pattern and to output a second full frame image from the second plurality of pairs of adjacent linear arrays having different pattern, wherein the sensor comprises a number of pixels and wherein each of the first full frame image and the second full frame image comprises the number of pixels of the sensor array.

8. The apparatus in claim 1, wherein the actuator comprises a micro-electrical mechanical system.

9. The apparatus in claim 1, wherein each of the plurality of Bayer patterns comprises a red pixel to sense red light, a blue pixel to sense blue light, and a pair of diagonal green pixels to sense green light.

10. The apparatus in claim 1 further comprising digital data storage to store an output generated from the sensor arrays.

11. The apparatus in claim 1 further comprising a digital signal processor to control one or more of the following: transferring the output to digital data storage, timing of the image acquisition, movement of the arrays, configuring the circuitry, configuring image formation, and generating images.

* * * * *